United States Patent
Swenson et al.

(10) Patent No.: US 11,839,164 B2
(45) Date of Patent: Dec. 5, 2023

(54) SYSTEMS AND METHODS FOR ADDRESSING DEVICES IN A SUPERCONDUCTING CIRCUIT

(71) Applicant: D-WAVE SYSTEMS INC., Burnaby (CA)

(72) Inventors: Loren J. Swenson, San Jose, CA (US); George E. G. Sterling, Vancouver (CA); Christopher B. Rich, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 762 days.

(21) Appl. No.: 16/996,595

(22) Filed: Aug. 18, 2020

(65) Prior Publication Data

US 2021/0057631 A1    Feb. 25, 2021

Related U.S. Application Data

(60) Provisional application No. 62/888,605, filed on Aug. 19, 2019.

(51) Int. Cl.
*H10N 60/12* (2023.01)
*G11C 11/44* (2006.01)
(Continued)

(52) U.S. Cl.
CPC ............. *H10N 60/12* (2023.02); *G06N 10/40* (2022.01); *G11C 8/00* (2013.01); *G11C 8/10* (2013.01);
(Continued)

(58) Field of Classification Search
CPC ........ H10N 60/805; H10N 60/12; G11C 8/00; G11C 8/10
See application file for complete search history.

(56) References Cited

U.S. PATENT DOCUMENTS 2,832,897 A    4/1958  Buck
2,865,006 A   12/1958  Samuel
(Continued)

FOREIGN PATENT DOCUMENTS

CA    2379144 A1    2/2001
CA    2386426 A1    5/2001
(Continued)

OTHER PUBLICATIONS

Likharev et al., "RSFQ logic/memory family: a new Josephson-junction technology for sub-terahertz-clock-frequency digital systems"; IEEE Transactions on Applied Superconductivity; vol. 1, No. 1; Mar. 1991.
(Continued)

*Primary Examiner* — Lam T Mai
(74) *Attorney, Agent, or Firm* — Cozen O'Connor

(57) ABSTRACT

Addressing a superconducting flux storage device may include applying a bias current, a low-frequency flux bias, and a high-frequency flux bias in combination to cause a combined address signal level to exceed a defined address signal latching level for the superconducting flux storage device. A bias current that, in combination with a low-frequency flux bias and a high-frequency flux bias, causes a combined address signal level to exceed a defined address signal latching level for a superconducting flux storage device is at least reduced by an asymmetry in the Josephson junctions of the CJJ. A low-frequency flux bias that, in combination with a bias current and a high-frequency flux bias, causes a combined address signal level to exceed a defined address signal latching level for a superconducting flux storage device is at least reduced by an asymmetry in the Josephson junctions of the CJJ.

24 Claims, 22 Drawing Sheets

(51) Int. Cl.
  *H03K 3/38*   (2006.01)
  *H03K 17/92*  (2006.01)
  *G11C 8/00*   (2006.01)
  *G06N 10/40*  (2022.01)
  *G11C 8/10*   (2006.01)
  *H10N 60/80*  (2023.01)
  *H10N 69/00*  (2023.01)

(52) U.S. Cl.
  CPC ............. *G11C 11/44* (2013.01); *H03K 3/38* (2013.01); *H03K 17/92* (2013.01); *H10N 60/805* (2023.02); *H10N 69/00* (2023.02)

(56) References Cited

U.S. PATENT DOCUMENTS

| | | |
|---|---|---|
| 3,200,368 A | 8/1965 | Stekly et al. |
| 3,267,396 A | 8/1966 | James |
| 3,380,004 A | 4/1968 | Hansen |
| 3,753,168 A | 8/1973 | Schor |
| 3,766,502 A | 10/1973 | Bronca et al. |
| 3,783,417 A | 1/1974 | Osada et al. |
| 4,028,714 A | 6/1977 | Henkels |
| 4,275,314 A | 6/1981 | Fulton |
| 4,342,013 A | 7/1982 | Kallman |
| 4,453,144 A | 6/1984 | Tamura et al. |
| 4,464,640 A | 8/1984 | Nishikawa et al. |
| 4,496,854 A | 1/1985 | Chi et al. |
| 4,707,184 A | 11/1987 | Hashiguchi et al. |
| 4,731,611 A | 3/1988 | Mueller et al. |
| 4,761,623 A | 8/1988 | Schneider |
| 4,781,969 A | 11/1988 | Kobayashi et al. |
| 4,797,596 A | 1/1989 | Tsuzurahara |
| 4,937,525 A | 6/1990 | Daalmans |
| 4,943,792 A | 7/1990 | Srivastava et al. |
| 4,947,118 A | 8/1990 | Fujimaki |
| 4,952,896 A | 8/1990 | Dawson |
| 4,956,642 A | 9/1990 | Harada |
| 4,983,971 A | 1/1991 | Przybysz et al. |
| 5,083,101 A | 1/1992 | Frederick |
| 5,128,675 A | 7/1992 | Harada |
| 5,146,191 A | 9/1992 | Mandai et al. |
| 5,150,086 A | 9/1992 | Ito |
| 5,162,731 A | 11/1992 | Fujimaki |
| 5,173,660 A | 12/1992 | Marsden |
| 5,227,365 A | 7/1993 | Van |
| 5,248,941 A | 9/1993 | Lee et al. |
| 5,307,068 A | 4/1994 | Hartemann |
| 5,313,176 A | 5/1994 | Upadhyay |
| 5,319,343 A | 6/1994 | Jeffries |
| 5,365,476 A * | 11/1994 | Mukhanov .............. G11C 11/44 327/527 |
| 5,392,012 A | 2/1995 | Iwata et al. |
| 5,398,030 A | 3/1995 | Sandell |
| 5,446,427 A | 8/1995 | Nakayama et al. |
| 5,616,539 A | 4/1997 | Hey-Shipton et al. |
| 5,618,777 A | 4/1997 | Hey-Shipton et al. |
| 5,831,489 A | 11/1998 | Wire |
| 5,869,846 A | 2/1999 | Higashino et al. |
| 5,917,066 A | 6/1999 | Eisenmann et al. |
| 5,936,458 A | 8/1999 | Rylov |
| 5,937,263 A | 8/1999 | Eisenmann et al. |
| 5,939,955 A | 8/1999 | Chen et al. |
| 5,974,335 A | 10/1999 | Talisa et al. |
| 5,982,219 A | 11/1999 | Kirichenko |
| 6,026,311 A | 2/2000 | Willemsen et al. |
| 6,094,110 A | 7/2000 | Reddy |
| 6,114,931 A | 9/2000 | Gevorgian et al. |
| 6,347,237 B1 | 2/2002 | Eden et al. |
| 6,627,916 B2 | 9/2003 | Amin et al. |
| 6,686,811 B2 | 2/2004 | Hey-Shipton |
| 6,784,451 B2 | 8/2004 | Amin et al. |
| 6,825,748 B1 | 11/2004 | Ibata et al. |
| 6,838,694 B2 | 1/2005 | Esteve et al. |
| 6,898,450 B2 | 5/2005 | Eden et al. |
| 6,984,846 B2 | 1/2006 | Newns et al. |
| 7,129,870 B2 | 10/2006 | Hirano et al. |
| 7,133,888 B2 | 11/2006 | Kohn et al. |
| 7,145,415 B2 | 12/2006 | Sengupta et al. |
| 7,164,331 B2 | 1/2007 | Reddy |
| 7,335,909 B2 | 2/2008 | Amin et al. |
| 7,365,663 B2 | 4/2008 | Rylov et al. |
| 7,456,702 B2 | 11/2008 | Keefe et al. |
| 7,477,060 B2 | 1/2009 | Yu et al. |
| 7,533,068 B2 | 5/2009 | Maassen et al. |
| 7,619,437 B2 | 11/2009 | Thom et al. |
| 7,624,088 B2 | 11/2009 | Johnson et al. |
| 7,733,253 B2 | 6/2010 | Kirichenko |
| 7,791,430 B2 | 9/2010 | Keefe et al. |
| 7,800,395 B2 | 9/2010 | Johnson et al. |
| 7,843,209 B2 | 11/2010 | Berkley |
| 7,859,364 B2 | 12/2010 | Sakisaka et al. |
| 7,876,248 B2 | 1/2011 | Berkley et al. |
| 7,990,662 B2 | 8/2011 | Berkley et al. |
| 8,008,991 B2 | 8/2011 | Tcaciuc et al. |
| 8,073,808 B2 | 12/2011 | Rose |
| 8,098,169 B2 | 1/2012 | Abraham et al. |
| 8,098,179 B2 | 1/2012 | Bunyk et al. |
| 8,159,313 B2 | 4/2012 | Uchaykin |
| 8,169,231 B2 | 5/2012 | Berkley |
| 8,179,133 B1 | 5/2012 | Kornev et al. |
| 8,190,548 B2 | 5/2012 | Choi |
| 8,195,596 B2 | 6/2012 | Rose et al. |
| 8,228,688 B2 | 7/2012 | Uchaykin et al. |
| 8,244,650 B2 | 8/2012 | Rose |
| 8,247,799 B2 | 8/2012 | Bunyk et al. |
| 8,279,022 B2 | 10/2012 | Thom et al. |
| 8,315,678 B2 | 11/2012 | Uchaykin |
| 8,346,325 B2 | 1/2013 | Thom et al. |
| 8,421,053 B2 | 4/2013 | Bunyk et al. |
| 8,436,354 B2 | 5/2013 | Aoki et al. |
| 8,441,329 B2 | 5/2013 | Thom et al. |
| 8,441,330 B2 | 5/2013 | Uchaykin |
| 8,604,669 B2 | 12/2013 | Hsieh et al. |
| 8,745,850 B2 | 6/2014 | Farinelli et al. |
| 8,772,759 B2 | 7/2014 | Bunyk et al. |
| 8,786,476 B2 | 7/2014 | Bunyk et al. |
| 8,854,704 B2 | 10/2014 | Takahashi |
| 8,933,695 B1 | 1/2015 | Kornev et al. |
| 9,170,278 B2 | 10/2015 | Neufeld |
| 9,231,181 B2 | 1/2016 | Thom et al. |
| 9,300,029 B2 | 3/2016 | Abraham et al. |
| 9,406,026 B2 | 8/2016 | Bunyk et al. |
| 9,465,401 B2 | 10/2016 | Uchaykin |
| 9,779,360 B2 | 10/2017 | Bunyk et al. |
| 10,003,217 B2 | 6/2018 | Kuerschner et al. |
| 10,528,886 B2 | 1/2020 | Boothby |
| 10,734,569 B2 * | 8/2020 | Goto ..................... G06N 10/00 |
| 11,127,893 B2 | 9/2021 | Johnson et al. |
| 2001/0025012 A1 | 9/2001 | Tarutani et al. |
| 2003/0016069 A1 | 1/2003 | Furuta et al. |
| 2003/0071258 A1 | 4/2003 | Zagoskin et al. |
| 2003/0224753 A1 | 12/2003 | Bremond et al. |
| 2005/0007096 A1 | 1/2005 | Dimino et al. |
| 2005/0047245 A1 | 3/2005 | Furuta et al. |
| 2005/0082519 A1 | 4/2005 | Amin et al. |
| 2005/0104683 A1 | 5/2005 | Cortes et al. |
| 2005/0184829 A1 | 8/2005 | Yoshimoto et al. |
| 2005/0250651 A1 | 11/2005 | Amin et al. |
| 2005/0256007 A1 | 11/2005 | Amin et al. |
| 2006/0147154 A1 | 7/2006 | Thom et al. |
| 2006/0225165 A1 | 10/2006 | Maassen et al. |
| 2006/0248618 A1 | 11/2006 | Berkley |
| 2007/0052441 A1 | 3/2007 | Taguchi et al. |
| 2008/0176750 A1 | 7/2008 | Rose et al. |
| 2008/0176751 A1 | 7/2008 | Tcaciuc et al. |
| 2008/0215850 A1 | 9/2008 | Berkley et al. |
| 2008/0238531 A1 | 10/2008 | Harris |
| 2008/0258849 A1 | 10/2008 | Keefe et al. |
| 2008/0284545 A1 | 11/2008 | Keefe et al. |
| 2009/0075825 A1 | 3/2009 | Rose et al. |
| 2009/0078931 A1 | 3/2009 | Berkley |
| 2009/0082209 A1 | 3/2009 | Bunyk et al. |
| 2009/0102580 A1 | 4/2009 | Uchaykin |

(56) References Cited

U.S. PATENT DOCUMENTS

| | | |
|---|---|---|
| 2009/0121215 A1 | 5/2009 | Choi |
| 2009/0122508 A1 | 5/2009 | Uchaykin et al. |
| 2009/0146599 A1 | 6/2009 | Zhou et al. |
| 2009/0168286 A1 | 7/2009 | Berkley et al. |
| 2009/0206871 A1 | 8/2009 | Baumgardner et al. |
| 2009/0241013 A1 | 9/2009 | Roetteler |
| 2009/0267635 A1 | 10/2009 | Herr et al. |
| 2009/0319757 A1 | 12/2009 | Berkley |
| 2010/0157522 A1 | 6/2010 | Refai-Ahmed |
| 2010/0157552 A1 | 6/2010 | Thom et al. |
| 2011/0022820 A1 | 1/2011 | Bunyk et al. |
| 2011/0065586 A1 | 3/2011 | Maibaum et al. |
| 2011/0089405 A1 | 4/2011 | Ladizinsky et al. |
| 2011/0094838 A1 | 4/2011 | Haack |
| 2011/0152104 A1 | 6/2011 | Farinelli et al. |
| 2011/0175061 A1 | 7/2011 | Berkley et al. |
| 2011/0183853 A1 | 7/2011 | Thom et al. |
| 2012/0088675 A1 | 4/2012 | Pires et al. |
| 2012/0094838 A1 | 4/2012 | Bunyk et al. |
| 2012/0135867 A1 | 5/2012 | Thom et al. |
| 2014/0137571 A1 | 5/2014 | Petroff et al. |
| 2014/0326001 A1 | 11/2014 | Citver et al. |
| 2015/0032994 A1 | 1/2015 | Chudak et al. |
| 2015/0092465 A1 | 4/2015 | Herr et al. |
| 2015/0263260 A1 | 9/2015 | Thom et al. |
| 2015/0276827 A1 | 10/2015 | Sharma et al. |
| 2016/0085616 A1 | 3/2016 | Berkley |
| 2016/0112031 A1 | 4/2016 | Abraham et al. |
| 2016/0121203 A1 | 5/2016 | Gomez et al. |
| 2016/0267032 A1 | 9/2016 | Rigetti et al. |
| 2017/0091648 A1 | 3/2017 | Abdo |
| 2017/0146579 A1 | 5/2017 | Beaty et al. |
| 2017/0162778 A1 | 6/2017 | Harris et al. |
| 2017/0178018 A1 | 6/2017 | Tcaciuc et al. |
| 2017/0269146 A1 | 9/2017 | Regau |
| 2018/0145631 A1 | 5/2018 | Berkley et al. |
| 2018/0321339 A1 | 11/2018 | Yang et al. |
| 2018/0336299 A1 | 11/2018 | Barzegar et al. |
| 2020/0050961 A1 | 2/2020 | Abdo |
| 2020/0083423 A1* | 3/2020 | Gota ............... H10N 69/00 |
| 2021/0057631 A1 | 2/2021 | Swenson et al. |
| 2021/0190885 A1* | 6/2021 | Swenson ........... H10N 60/12 |
| 2022/0103172 A1* | 3/2022 | Mundhada ......... H10N 69/00 |
| 2023/0142878 A1* | 5/2023 | Yamaji .............. H10N 60/12 |
| | | 324/248 |

FOREIGN PATENT DOCUMENTS

| | | |
|---|---|---|
| CN | 1470883 A | 1/2004 |
| CN | 101108102 A | 12/2007 |
| CN | 101868802 A | 12/2013 |
| CN | 107580752 A | 1/2018 |
| CN | 107924982 A | 4/2018 |
| CN | 107925146 A | 4/2018 |
| DE | 4119880 A1 | 1/1993 |
| EP | 0148479 A2 | 7/1985 |
| EP | 0707349 A1 | 4/1996 |
| JP | 51-084591 | 7/1976 |
| JP | 63226981 A | 9/1988 |
| JP | H05114756 A | 5/1993 |
| JP | 2001345488 A | 12/2001 |
| JP | 2002374107 A | 12/2002 |
| JP | 2007074120 A | 3/2007 |
| JP | 2010187240 A | 8/2010 |
| JP | 2011524043 A | 8/2011 |
| JP | 2012519379 A | 8/2012 |
| JP | 2016538809 A | 12/2016 |
| JP | 2019521546 A | 7/2019 |
| SU | 539333 A1 | 12/1976 |
| WO | 9609654 A1 | 3/1996 |
| WO | 2005093649 A1 | 10/2005 |
| WO | 2006043879 A1 | 4/2006 |
| WO | 2006066415 A1 | 6/2006 |
| WO | 2007085074 A1 | 8/2007 |
| WO | 2008029815 A1 | 3/2008 |
| WO | 2008138150 A1 | 11/2008 |
| WO | 2009039634 A1 | 4/2009 |
| WO | 2009120638 A2 | 10/2009 |
| WO | 2009149086 A2 | 12/2009 |
| WO | 2010028183 A2 | 3/2010 |
| WO | 2013190263 A1 | 12/2013 |
| WO | 2016183213 A1 | 11/2016 |
| WO | 2017055946 A1 | 4/2017 |
| WO | 2017074386 A1 | 5/2017 |
| WO | 2017115008 A1 | 7/2017 |
| WO | 2017192733 A2 | 11/2017 |
| WO | 2018055472 A1 | 3/2018 |
| WO | 2018106942 A1 | 6/2018 |
| WO | 2022140165 A1 | 6/2022 |

OTHER PUBLICATIONS

Likharev et al., "Reversible Conveyer Computation in Array of Parametric Quantrons," IEEE Transactions on Magnetics MAG-21(2):947-950, 1985.

Likharev, "Classical and Quantum Limitations on Energy Consumption in Computation," International Journal of Theoretical Physics 21(3/4):311-326, 1982.

Likharev, "Dynamics of Some Single Flux Quantum Devices: I. Parametric Quatron," IEEE Transactions on Magnetics MAG-13(1):242-244, 1977.

Lukashenko et al., "Improved powder filters for qubit measurements", Review of Scientific Instruments 79(014701): 1-4, 2001.

Maasen van den Brink et al., "Mediated Tunable Coupling of Flux Qubits," New Journal of Physics 7(230) 2005, 19 pages.

Madou, Fundamentals of Microfabrication, Second Edition, CRC Press LLC, Boca Raton, Florida, 2002. (book details provided).

Makhlin et al., "Quantum-state engineering with Josephson-junction devices," Reviews of Modern Physics 73 (2):357-400, Apr. 2001.

Mc Hugh et al., "A quantum computer using a trapped-ion spin molecule and microwave radiation," arXiv:quant-ph/0310015v2, pp. 1-9, Apr. 13, 2004.

Milliken et al. "50 Ω characteristic impedance low-pass metal powder filters," Review of Scientific Instruments 78 (2):024701, 2007, 5 pages.

Zorin, "The thermocoax cable as the microwave frequency filter for single electron circuits", Rev. Sci. Instrum. 66(8): 4296-4300, Aug. 1995.

Mizugaki et al., "Single-flux-quantum pump based on a three-junction superconducting quantum interference device", Applied Physics Letters, vol. 80(24), Jun. 17, 2002, 3 pages.

Mooij et al., "Josephson Persistent-Current Qubit," Science 285:1036-1039, Aug. 13, 1999.

Mueller, et al., "Printed Circuit Board Metal Powder Filters for Low Electron Temperatures", ArXiv: 1304.3306, Apr. 11, 2013, 13 pages.

Whittaker, J.D., et al., "A frequency and sensitivity tunable microresonator array for high-speed quantum," arXiv:1509.05811v2 [quant-ph], Apr. 22, 2016, 8 pages., Apr. 22, 2016.

Naaman, O. et al., "On-Chip Josephson Junction Microwave Switch," arXiv:1512.01484v1 [cond-mat.supr-con] Dec. 4, 2015, 10 pages.

Nielsen et al., Quantum Computation and Quantum Information, Cambridge University Press, Cambridge, 2000, "7.8 Other implementation schemes," pp. 343-345.

Nielsen, "Cluster-State Quantum Computation," arXiv:quant-ph/0504097v2, pp. 1-15, Jul. 1, 2005.

Orlando et al., "Superconducting persistent-current qubit," Physical Review B 60(22):15398-15413, Dec. 1, 1999.

Partanen et al., "Flux-tunable heat sink for quantum electric circuits", ArXiv:1712.10256, Dec. 29, 2017.

Pechal et al., "Superconducting Switch for Fast On-Chip Routing of Quantum Microwave Fields," arXiv:1606.01031v1 [quant-ph] Jun. 3, 2016, 8 pages.

Plourde et al., "Entangling Flux Qubits with a Bipolar Dynamic Inductance," Physical Review B 70, arXiv:quant-ph/0406049v1, Jun. 8, 2004, 4 pages.

(56) References Cited

OTHER PUBLICATIONS

Poulin et al., "A Superconducting Microwave Switch," IEEE Transactions on Applied Superconductivity 5(2): 3046-3048, 1995.
Powell et al., "Thermal Conductivity of Metals and Alloys at Low Temperatures", National Bureau of Standards Circular 556, Sep. 1, 1954.
Rose et al., "Systems, Devices and Methods for Interconnected Processor Topology," U.S. Appl. No. 12/013,192, filed Jan. 11, 2008, 47 pages.
Ryan et al., "Characterization of complex quantum dynamics with a scalable NMR information processor," arXiv:quant-ph/0506085v2, pp. 1-4, Feb. 13, 2006.
Santavicca et al., "Impedance-Matched Low-Pass Stripline Filters," arXiv:0802.1343 [physics.ins-det] 2008, 9 pages.
Shabani et al., "Artificial Quantum Thermal Bath: Engineering Temperature for a Many-Body Quantum System," arXiv:1510.04354v2 [quant-ph] Nov. 4, 2016, 10 pages.
Shirts et al., "Computing: Screen Savers of the Word Unite!," Science Online 290(5498): 1903-1904, Dec. 8, 2000.
Shnirman et al., "Quantum Manipulations of Small Josephson Junctions," Physical Review Letters 79(12): 2371-2374, Sep. 22, 1997.
Shoji et al., "New fabrication process for Josephson tunnel junctions with (niobium nitride, niobium) double-layered electrodes," Appl. Phys. Lett. 41(11): 1097-1099, Dec. 1, 1982.
Shor, "Introduction to Quantum Algorithms," AT&T Labs—Research, arXiv:quant-ph/0005003 v2, pp. 1-17, Jul. 6, 2001.
Swenson et al., "Operation of a titanium nitride superconducting microresonator detector in the nonlinear regime," arXiv:1305.4281v1 [cond-mat.supr-con], May 18, 2013, 11 pages.
Thaker et al., "Quantum Memory Hierarchies: Efficient Designs to Match Available Parallelism in Quantum Computing," arXiv:quant-ph/0604070v1, 12 pages, Apr. 10, 2006.
Tuorila et al., "Efficient Protocol for Qubit Initialization with a Tunable Environment," arXiv:1612.04160v1 [cond-mat.mes-hall] Dec. 13, 2016, 17 pages.
Van Zant, "Microchip Fabrication", Fourth Edition, McGraw-Hill, New York, 2000. (book details provided).
Masov, "Von Neumann Quantum Processors," arXiv:quant-ph/0311196v1, pp. 1-8, Nov. 27, 2003.
Watanabe et al., "Resonance-Free Low-Pass Filters for the AC Josephson Voltage Standard," IEEE Transactions on Applied Superconductivity 16(1):49-53, 2006.
Williams, "Explorations in Quantum Computing", Springer, New York, Dec. 12, 1997, Chapter 11, "How to Make a Quantum Computer," pp. 241-265.
Wollack et al., "Impedance Matched Absorptive Thermal Blocking Filters," arXiv:1403.2909v1 [astro-ph.IM] Mar. 12, 2014, 5 pages.
Written Opinion for PCT/US2017/030857, dated Jul. 24, 2017, 10 pages.
Written Opinion, dated Mar. 18, 2008, for PCT/CA2007/002192, 5 pages.
X. Ning, "The development status and practical application prospects of superconducting technology" China Academia Journal Electronic Publishing House, HttP>//www.cnki.net, Application 2003, 3 pages.
Yeap, K.H. et al., "Attenuation in Superconducting Circular Waveguides," Advanced Electromagnetics vol. 5, No. 2, Sep. 2016, 5 pages.
Campbell, T. et al., "Dynamics of Oxidation of Aluminum Nanoclusters using Variable Charge Molecular-Dynamics Simulations on Parallel Computers," Physical Review Letters, vol. 82, No. 24, Jun. 14, 1999, 4 pages.
Yoon, K., et al. "Atomic-Scale Chemical Analyses of Niobium Oxide/Niobium Interfaces via Atom-Probe Tomography," Applied Physics Letters, vol. 93, 2008, 3 pages.
Bunyk et al., "RSFQ Technology: Physics and Devices", World Scientific International Journal of High Speed Electronics and Systems, vol. 11, No. 01, pp. 257-305 (2001).
Butcher, J.R., "Advances in Persistent-Current Qubit Research: Inductively Coupled Qubits and Novel Biasing Methods," Final Report, Delft University of Technology, Jan. 14, 2002, 52 pages.
Chapman et al., "General Purpose Multiplexing Device for Cryogenic Microwave Systems," arXiv:1603.02716v2 [quant-ph] May 31, 2016, 10 pages.
Chapman et al., "Widely Tunable On-Chip Microwave Circulator for Superconducting Quantum Circuits," Physical Review, vol. 7. 2017, 16 pages.
Chinese Office Action dated Jul. 22, 2021 for Chinese Application No. 201980047690.7 in 8 pages.
Choi, "Systems, Devices, and Methods for Analog Processing," U.S. Appl. No. 60/986,554, filed Nov. 8, 2007, 39 pages.
Choudhury, "Handbook of Microlithography, Micromachining and Microfabrication vol. 1: Microlithography", The International Society for Optical Engineering, Bellingham, WA, 1999. (book details provided).
Clarke et al., "Quiet Readout of Superconducting Flux States," Physica Scripta. T102: 173-177, 2002.
Cosmelli, C., "Controllable Flux Coupling for the Integration of Flux Qubits," arXiv:cond-mat/0403690v1 [cond-mat.supr-con]. Mar. 29, 2004, 10 pages.
Deutsch, "Quantum theory, the Church-Turing principle and the universal quantum computer," Appeared in Proceedings of the Royal Society of London A 400: 97-117, 1985.
Dickson et al., "Thermally Assisted Quantum Annealing of a 16-Qubit Problem," Nature Communications, 2013, 6 pages.
Dolan et al., "Optimization on the NEOS Server," from SIAM News 35(6): 1-5, Jul./Aug. 2002.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feynman, "Simulating Physics with Computers," International Journal of Theoretical Physics 21(6/7): 467-488, 1982.
Filippov et al., "Tunable Transformer for Qubits Based on Flux States," IEEE Transactions on Applied Superconductivity 13(2): 1-4, Jun. 2003.
Fourer et al., "Optimization as an Internet Resource," Interfaces 31(2): 130-150, Mar.-Apr. 2001.
Friedman et al., "Quantum superposition of distinct macroscopic states," Nature 406:43-46, Jul. 6, 2000.
Fritzsch et al., "SNS and SIS Josephson junctions with dimensions down to the sub-µm region prepared by an unified technology," Supercond. Sci. Tech. 12: 880-882, 1999.
Fukushima, A. et al., "Attenuation of Microwave Filters for Single-Electron Tunneling Experiments," IEEE Transactions on Instrumentation and Measurement, 46(2):289-293, 1997.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Ghiu et al., "Asymmetric two-output quantum processor in any dimension," arXiv:quant-ph/0610138v1, pp. 1-8, Oct. 17, 2006.
Harris et al., "Sign and Magnitude Tunable Coupler for Superconducting Flux Qubits," arXiv:cond-mat/0608253v1 [cond-mat.supr-con], Aug. 11, 2006. 5 pages.
Harris, "Systems, Devices, and Methods for Controllably Coupling Qubits," U.S. Appl. No. 12/017,995, filed Jan. 22. 2008, 33 pages.
Hillery et al., "Approximate programmable quantum processors," arXiv:quant-ph/0510161v1, pp. 1-7, Oct. 20, 2005.
Hioe and Goto, Quantum Flux Parametron—A Single Quantum Flux Superconducting Logic Device, World Scientific Publishing Co. Pte. Ltd., Singapore, pp. 23-43, 1991.
Il'ichev et al., "Continuous Monitoring of Rabi Oscillations in a Josephson Flux Qubit," Physical Review Letters 91(9): 097906-1-097906-4, week ending Aug. 29, 2003.
International Preliminary Report on Patentability for PCT/US2017/030857, dated Nov. 6, 2018, 11 pages.
International Search Report and Written Opinion for PCT/US2019/032689 dated Sep. 16, 2019, 13 pages.
International Search Report for PCT/US2017/030857, dated Jul. 24, 2017, 3 pages.

(56) References Cited

OTHER PUBLICATIONS

International Search Report, dated Mar. 18, 2008, for PCT/CA2007/002192, 4 pages.
Jin et al., "Distributed microwave damping filters for superconducting quantum interference devices", Appl. Phys. Lett. 70(16):2186-2188, Apr. 21, 1997.
Johnson et al., "Scalable Control System for a Superconducting Adiabatic Quantum Optimization Processor," Superconductor Science & Technology (2010).
Jones et al., "Highly Controllable Qubit-Bath Coupling Based on a Sequence of Resonators," arXiv:1304.4829v2 [cond-mat.mes-hall] Sep. 27, 2013, 11 pages.
Jones et al., "Tunable electromagnetic Environment for Superconducting Quantum Bits," arXiv:1320.3824v5 [cond-mat.mes-hall] Jun. 13, 2013, 11 pages.
Kaiser et al., "Coherent Atomic Matter Waves: Proceedings of the Les Houches Summer School, Session LXXII in 1999," Springer-Verlag, New York, ISBN 286883499X, pp. 184-188, 294-295, 302-303.
Koch et al., "Model for I/f Flux Noise in SQUIDs and Qubits," pp. 1-14, May 5, 2007.
Lee et al., "Investigation of the Dependences of the Attenuation Properties of Cryogenic Metal-Powder Filters on the Preparation Method", Springer, Apr. 18, 2018.
Lee et al., "Study on the fabrication of low-pass metal powder filters for use at cryogenic temperatures", Springer, Aug. 18, 2016.
Levinson, "Principles of Lithography", The International Society for Optical Engineering, Bellingham, WA, 2001. (book details provided).
Levitov, et al., "Quantum Spin Chains and Majorana States in Arrays of Coupled Qubits," arXiv:cond-mat/0108266v2 [cond-mat.mes-hall]. Aug. 19, 2001, 7 pages.
English translation of Office Action dated Sep. 30, 2022, in JP App No. 2021-149531, 10 pages.
Berkley, "A Josephson Junction Qubit", Dissertation University of Maryland, 2003.
Notice of Reasons for Rejection dated Jun. 27, 2023, for Japanese Application No. 2022-564258, 6 pages.
"A High-Level Look at Optimization: Past, Present and Future," e-Optimization.Community, May 2000, pp. 1-5.
Allen et al., "Blue Gene: A vision for protein science using a petaflop supercomputer," IBM Systems Journal 40(2): 310-327, 2001.
Amin et al., "Thermally assisted adiabatic quantum computation," arXiv:cond-mat/0609332v2, pp. 1-5, Mar. 2, 2007.
Averin et al., "Variable Electrostatic Transformer: Controllable Coupling of Two Charge Qubits," Physical Review Letters 91(5): 057003-1-057003-4, Aug. 1, 2003.
B. H. Eom et al., "Wideband, Low-Noise Superconducting Amplifier with High Dynamic Range", arXiv:1201.2392v1 [cond-mat.supr-con], 2012, 23 pages.
Bladh et al., "Comparison of Cryogenic Filters for use in Single Electronics Experiments," Review of Scientific Instruments 74(3):1323-1327, 2003.
Blatter et al., "Design aspects of superconducting-phase quantum bits," Physical Review B 63: 174511-1-174511-9, 2001.
Bocko et al., "Prospects for Quantum Coherent Computation Using Superconducting Electronics," IEEE Transactions on Applied Superconductivity 7(2):3638-3641, Jun. 1997.
Bordier et al., "Superconducting Coplanar Switch and Phase Shifter for CMB Applications," J Low Temp Phys, 2016, 7 pages.
Brennen et al., "Why should anyone care about computing with anyons?," arXiv:0704.2241v1 [quant-ph], pp. 1-12, Apr. 18, 2007.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Berkley, et al., "A scalable readout system for a superconducting adiabatic quantum optimization system", arXiv, May 6, 2009, 18 pages.
Hioe, et al., "Quantum Flux Parametron"—A Single Quantum Flux Superconducting Logic Device, World Scientific Publishing Co. Pte. Ltd., Singapore, 1991, pp. 23-41.
Hosoya, Mutsumi, et al., "Operation of a 1-bit Quantum Flux Parametron shift register (latch) by 4-phase 36-GHz clock", IEEE Transactions on Applied Superconductivity, vol. 5, No. 2, 1995, pp. 2831-2834.
Inokuchi, "Analog Computation Using Quantum-Flux Parametron Devices," Physica C 357-360 :1618-1621, 2001.
Maibaum, et al., Systems, Methods and Apparatus for Superconducting Demultiplexer Circuits, U.S. Appl. No. 61/058,494, filed Jun. 3, 2008, 66 pages.
Niepce, D., "Fabrication and Characterisation of Thin-Film Superconducting Nanowire Superconductors for Novel Quantum Devices", Master's Thesis in Nanoscience, Chalmers University of Technology, ISSN 1652-8557, 2014, 66 pages.
McKenney, et al., "Design considerations for a background limited 350 micron pixel array using lumped element superconducting microresonators", SPIE, Sep. 24, 2012, 10 pages.
Miller, "A Single-Flux-Quantum Demultiplexer," IEEE Transactions on Applied Superconductivity 7(2):2690-2692, 1997.
Semenov, et al., "Classical and Quantum Operation Modes of the Reversible Logic Circuits," Department of Physics and Astronomy, Stony Brook University, Stony Brook, New York, Presentation, Dec. 2006, 29 pages.
Bunyk et al., "Architectural Considerations in the Design of a Superconducting Quantum Annealing Processor," IEEE Trans. Appl. Supercond., 24, No. 4, Aug. 2014, 10 pages.
First Office Action issued in Chinese No. 2017800268619 with English translation, dated Sep. 6, 2022, 12 pages.
Whittaker, J.D. et al., "A Frequency and Sensitivity Tunable Microresonator Array for High-Speed Quantum Processor Readout," arXiv:1509.05811v2 [quant-ph], Apr. 22, 2016, 8 pages.
First Office Action dated Oct. 14, 2022 for CN 2020-519439, English translation, 4 pages.

\* cited by examiner

SYSTEMS AND METHODS FOR ADDRESSING DEVICES IN A SUPERCONDUCTING CIRCUIT

TECHNICAL FIELD

This disclosure generally relates to systems and methods for addressing devices in a superconducting circuit, and, more specifically, to systems and methods for resonator-addressing of superconducting flux storage devices and digital-to-analog converters (DAC) in superconducting integrated circuits.

BACKGROUND

Frequency Multiplexed Resonant (FMR) Readout

Superconducting microwave resonators can be used in a variety of fields including, but not limited to, quantum computation and astronomy. In quantum computation, superconducting resonators can be used to detect the state of qubits, for example the state of superconducting qubits in a superconducting quantum processor. In astronomy, superconducting microwave resonators can be used in Microwave Kinetic Inductance Detectors (MKIDs).

Multiple resonators (detectors) can be coupled to a common transmission line and integrated through frequency domain multiplexing. Frequency-domain multiplexing (FDM) is a technique in which a communication bandwidth is divided into a number of non-overlapping sub-bands, and each sub-band used to carry a separate signal. Frequency-domain multiplexing is also referred to in the present application as frequency multiplexing and frequency-division multiplexing.

Using FMR technology, superconducting resonators of different resonant frequencies can be used for readout of multiple qubits, for example. The resonators can share a common microwave transmission line by using frequency-domain multiplexing.

BRIEF SUMMARY

A superconducting integrated circuit may be summarized as comprising a microwave transmission line; a superconducting flux storage device comprising a loop of material that is superconductive below a critical temperature interrupted by an asymmetric compound Josephson junction (CJJ), the asymmetric CJJ comprising a first parallel current path interrupted by a first Josephson junction, the first Josephson junction characterized by a first critical current; and a second parallel current path interrupted by a second Josephson junction, the second parallel current path electrically in parallel with the first parallel current path, the second Josephson junction characterized by a second critical current, the second critical current of the second Josephson junction different from the first critical current of the first Josephson junction; a first superconducting resonator communicatively coupled to the microwave transmission line; and a first signal interface that inductively communicatively couples the first superconducting resonator to the superconducting flux storage device, wherein the first signal interface is operable to provide a first flux bias to the superconducting flux storage device.

The superconducting integrated circuit may further comprise a low-frequency address bias line; and an address interface that inductively communicatively couples the low-frequency bias address line to the superconducting flux storage device, wherein the address interface is operable to provide a second flux bias to the superconducting flux storage device. The superconducting flux storage device may comprise a superconducting digital-to-analog converter (DAC), the superconducting DAC which is operable to perform latching, and the superconducting DAC is programmed by a low-frequency bias signal carried by the low-frequency address bias line and by a microwave signal carried by the first superconducting resonator, which combine constructively to exceed a threshold address latching level, the low-frequency bias signal carried by the low-frequency address bias line which is at least reduced by a factor that depends on a difference between the first critical current of the first Josephson junction of the CJJ and the second critical current of the second Josephson junction of the CJJ.

The superconducting integrated circuit may further comprise a current bias line, wherein a current in the current bias line is an alternating current. The alternating current may have no DC component.

The superconducting integrated circuit may further comprise a second superconducting resonator communicatively coupled to the microwave transmission line; and a second signal interface that inductively communicatively couples the second superconducting resonator to the superconducting flux storage device, wherein the second signal interface is operable to provide a second flux bias to the superconducting flux storage device. The first superconducting resonator may extend along a first axis and the second superconducting resonator may extend along a second axis, the second axis perpendicular to the first axis. The superconducting flux storage device may be XY-addressed by two microwave signals, a first one of the two microwave signals carried by the first superconducting resonator, and a second one of the two microwave signals carried by the second superconducting resonator, each of the first and the second superconducting resonator having a respective resonant frequency, the respective resonant frequencies of the first and the second superconducting resonators which in operation add constructively at the superconducting flux storage device. The respective resonant frequencies of the first and the second superconducting resonators may add constructively at the superconducting flux storage device to provide a beat signal, a frequency of the beat signal which is matched to a linewidth of at least one of the first and the second superconducting resonators. The superconducting flux storage device may comprise a superconducting digital-to-analog converter (DAC), the superconducting DAC which is operable to perform latching, and the superconducting DAC may be programmed by a low-frequency bias signal carried by a low-frequency address bias line and by two microwave signals, which combine constructively to exceed a threshold address latching level, the low-frequency bias signal carried by the low-frequency address bias line which is at least reduced by a factor that depends on a difference between the first critical current of the first Josephson junction of the CJJ and the second critical current of the second Josephson junction of the CJJ.

A size of the second Josephson junction may be different from a size of the first Josephson junction.

A method of loading a superconducting flux storage device with a magnetic flux quantum, the superconducting flux storage device comprising a superconducting flux storage loop interrupted by an asymmetric compound Josephson junction (CJJ), the asymmetric CJJ comprising a first parallel current path interrupted by a first Josephson junction, the first Josephson junction characterized by a first critical current; and a second parallel current path interrupted by a second Josephson junction, the second parallel current path electrically in parallel with the first parallel current path, the second Josephson junction characterized by a second critical current, the second critical current of the second Josephson junction different than the first critical current of the first Josephson junction, the superconducting flux storage devices, may be summarized as comprising applying a first high-frequency pulse to at least a first superconducting resonator by a microwave transmission line, the microwave transmission line communicatively coupled to the at least a first superconducting resonator; and applying the first high-frequency pulse to the superconducting flux storage device by the at least a first superconducting resonator, the at least a first superconducting resonator communicatively coupled to the superconducting flux storage device to cause a flux quantum to be added to the asymmetric CJJ of the superconducting flux storage device.

The method may further comprise setting a current bias line to a first current bias value; setting a low-frequency address line to a first address line value; setting the current bias line to a second current bias line value to cause a current bias to be applied to the superconducting flux storage device; setting the low-frequency address line to a second address line value to cause a flux bias to be applied to the asymmetric CJJ of the superconducting flux storage device; after the applying a first high-frequency pulse to the superconducting flux storage device, setting the low-frequency address line to a third address line value to cause the flux quantum to be loaded into the superconducting flux storage loop of the superconducting flux storage device; returning the current bias line to the first current bias line value; and returning the low-frequency address line to the first address line value, wherein applying a first high-frequency pulse to the superconducting flux storage device by a microwave transmission line and a first superconducting resonator includes causing a combined low-frequency and high-frequency signal level applied to the superconducting flux storage device to exceed a predetermined upper threshold, and wherein at least one of the second current bias line value and the second address line value is at least reduced by a factor that depends on a difference between the first critical current of the first Josephson junction of the asymmetric CJJ and the second critical current of the second Josephson junction of the asymmetric CJJ. Setting the low-frequency address line to a third address line value to cause the flux quantum to be loaded into the superconducting flux storage loop of the superconducting flux storage device may include setting the low-frequency address line to a third address line value to cause the flux quantum to be loaded into a superconducting digital-to-analog converter (DAC).

Applying a first high-frequency pulse to the superconducting flux storage device by a microwave transmission line and at least a first superconducting resonator may include applying a set of frequency-domain multiplex signals to each of the first superconducting resonator and at least a second superconducting resonator.

The method may further comprise applying the first high-frequency pulse to a second superconducting flux storage device by the microwave transmission line and the at least a first superconducting resonator.

Applying a first high-frequency pulse to the superconducting flux storage device by a microwave transmission line and at least a first superconducting resonator may include applying a first high-frequency pulse to a superconducting digital-to-analog converter (DAC) by the microwave transmission line and a first and at least a second superconducting resonator, the superconducting DAC operable to perform latching. The method may further comprise programming the superconducting DAC by a low-frequency bias signal carried by a first low-frequency address bias line and by two microwave signals, the low-frequency bias signal and the two microwave signals which combine constructively to exceed a threshold address latching level.

The method may further comprise applying an alternating current on a current bias line. Applying an alternating current on a current bias line may include applying an alternating current having no DC component.

A superconducting integrated circuit may be summarized as comprising a superconducting flux storage device, the superconducting flux storage device which comprises a loop of material that is superconductive in a range of temperatures, the loop of material which is interrupted by at least one Josephson junction; and a first addressing line communicatively coupled to the superconducting flux storage device, wherein a current in the first addressing line is an alternating current. The at least one Josephson junction may be a compound Josephson junction (CJJ), the CJJ comprising a first parallel current path which is interrupted by a first Josephson junction; and a second parallel current path which is interrupted by a second Josephson junction, the second parallel current path which is electrically in parallel with the first parallel current path. Where the first parallel current path is further interrupted by a first inductance and the second parallel current path is further interrupted by a second inductance, the superconducting integrated circuit may further comprise a second addressing line which is inductively coupled to the first inductance; and a third addressing line which is inductively coupled to the second inductance. Where the loop of material includes a third inductance, the superconducting integrated circuit may further comprise a device inductively communicatively coupled to the superconducting flux storage device by the third inductance.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn, are not necessarily intended to convey any information regarding the actual shape of the particular elements, and have been solely selected for ease of recognition in the drawings.

FIG. 7A is a graph showing a plot of an address signal current as a function of time; FIG. 7B is a graph showing a plot of a power signal current as a function of time; and FIG. 7C is a graph showing a plot of a persistent current in a compound Josephson junction (CJJ) loop of the superconducting DAC as a function of time.

DETAILED DESCRIPTION

Preamble

Figure 1:
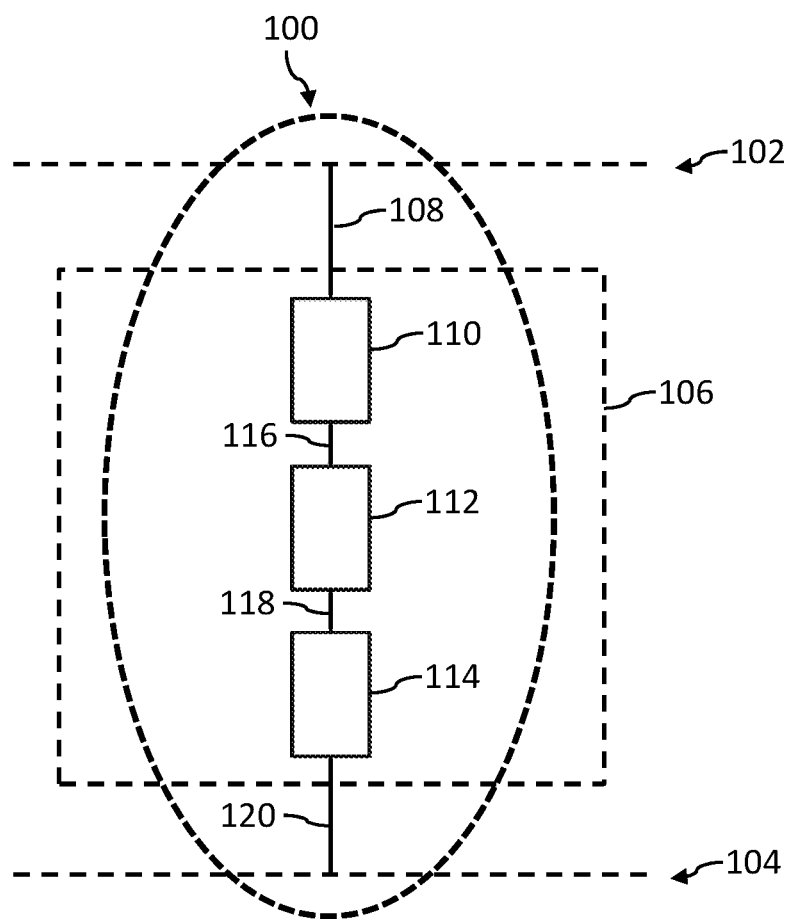
FIG. 1 is a schematic diagram illustrating an example implementation of a microwave path to a superconducting circuit, according to the present disclosure.

In the following description, some specific details are included to provide a thorough understanding of various disclosed implementations and embodiments. One skilled in the relevant art, however, will recognize that embodiments may be practiced without one or more of these specific details, or with other methods, components, materials, etc. In other instances, well-known structures associated with superconductive devices and integrated superconductive circuits have not been shown or described in detail to avoid unnecessarily obscuring descriptions of the implementations or embodiments of the present methods. Throughout this specification and the appended claims, the words "element" and "elements" are used to encompass, but are not limited to, all such structures, systems, and devices associated with superconductive circuits and integrated superconductive circuits.

Unless the context requires otherwise, throughout the specification and claims which follow, the word "comprise" is synonymous with "including," and is inclusive or open-ended (i.e., does not exclude additional, unrecited elements or acts).

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

It should be noted that, as used in this specification and the appended claims, the singular forms "a," "an," and "the" include plural referents unless the content clearly dictates otherwise. Thus, for example, reference to a readout system including "a superconducting resonator" includes a single superconducting resonator, or two or more superconducting resonators. It should also be noted that the term "or" is generally employed in its sense including "and/or" unless the content clearly dictates otherwise.

The headings provided herein are for convenience only and do not interpret the scope or meaning of the embodiments.

Superconducting Flux Storage Devices

Superconducting flux storage devices are also referred to in the present application as superconducting digital-to-analog converters (DACs) and flux DACs.

While a single qubit, or a handful of them, can be precisely controlled using dedicated analog lines driven by room-temperature electronics, integrating more than a few dozen qubits on a single chip can preferably be implemented using on-chip control circuitry. In one implementation of a quantum processor that includes superconducting qubits and couplers, there can be six control parameters per qubit, and one control parameter per coupler. Static flux biases can be selectively applied to superconducting loops in order to realize at least some of the control parameters. The desired values of flux biases can be programmed into control devices using a relatively small number of control lines that carry signals generated at room temperature.

In some implementations, control devices can combine the functions of persistent memory and digital-to-analog conversion, and are referred to in the present application as flux DACs. In an example implementation, each flux DAC has a size of about 10 µm. Having several of them attached to a single qubit can set a lower bound on qubit size, and can influence possible qubit shapes, hardware graph topologies, and processor architecture.

XYZ-Addressing of Flux DACs In an example implementation of a quantum processor, 512 qubits and associated coupling devices can be controlled by 4608 flux DACs. An XYZ-addressing approach can control the quantum processor using only 56 lines. The processor can be arranged as an 8×8 array of tiles, each tile having 72 flux DACs. The flux DACs of each tile can be arranged in a respective 3-DAC plaquette. One of each set of three DACs in a 3-DAC plaquette can be selected using one of three lines (referred to in the present application as address (ADDR) lines), all three sharing another line (referred to in the present application as a trigger (TRIG) line), in an arrangement that uses 15 ADDR lines and 5 TRIG lines to address DACs in the tile. The 8×8 array of tiles can be divided into 16 domains (referred to in the present application as power (PWR) domains), and arranged such that 4608 flux DACs can be addressed using 30 ADDR lines, 10 TRIG lines, and 16 PWR lines in total. See for example Bunyk P. et al., "ARCHITECTURAL CONSIDERATIONS IN THE DESIGN OF A SUPERCONDUCTING QUANTUM ANNEALING PROCESSOR", arXiv:1401.5504v1, 21 Jan. 2014.

A shortcoming of the DAC addressing scheme described above can be that implementation can include a large number of wires and superconducting low-pass filters which can be costly to produce, vulnerable to failure, and a source of high-energy photons from internal filter heating. In some implementations, the wires are twisted-pairs and the low-pass filters are custom-made superconducting low-pass filters. The systems and methods described in the present application include replacing wires by coaxial cable which can provide greater bandwidth and reduced complexity. A benefit of greater bandwidth can be improved processor input/output (I/O) speed.

Superconducting Resonators

When high-bandwidth lines are available for communicating with the processor, more efficient use of the bandwidth can be made by coupling the high-bandwidth line to a suitable on-chip element. An example on-chip element suitable for coupling to a high-bandwidth transmission line is a superconducting resonator. An advantage of using a superconducting resonator is that, similar to FMR readout or microwave kinetic-inductance detectors (MKIDs), these devices can be compatible with frequency-domain multiplexing. An array of resonators can be coupled to a single transmission line using frequency-domain multiplexing by tuning a resonant frequency of each resonator. The resonant frequency can be tuned, for example, by adjusting a length of the resonator, and/or by adding additional capacitance. In one implementation, the resonator is a half-wave superconducting resonator. Microwave current can be excited when the resonator is driven near its resonant frequency. Addressing can be achieved by selectively transmitting a set of tones corresponding to a set of resonators in the array of resonators.

Distributed Superconducting Resonators

One implementation of a superconducting resonator is a distributed superconducting resonator. An example of a distributed superconducting resonator is half-wavelength ($\lambda/2$) resonator. A half-wavelength resonator can generally provide sufficient usable wiring length for coupling to another device. A shortcoming of a half-wavelength resonator can be that the presence of harmonics at integer multiples of the fundamental resonant frequency can constrain an array of superconducting resonators to one octave of bandwidth.

An additional shortcoming can be that the current distribution can vary sinusoidally along the wiring length, with a peak value occurring at the center of the device. One approach to mitigating the variation in current is to use only a section of the length of the resonator, for example a section in which the variation in current remains within, say, 90% of the peak value. Another approach is to vary the strength of coupling of the resonator to devices coupled along the length of the resonator. Yet another approach is to adjust the driving amplitudes of intersecting resonators to compensate for the resonator current distribution. The latter approach can be used in the XY-addressing scheme described below, for example. In some implementations, resonators are operated individually. In some implementations, resonators are operated in groups of resonators.

Another example of a distributed superconducting resonator is a quarter-wavelength ($\lambda/4$) resonator. The peak current for a quarter-wavelength resonator is at one end of the resonator. Variation in current along the body of the resonator can be mitigated by using only a section of the length of the resonator, specifically a section at or near the end where the current is within, say 90% of the peak value.

Lumped-Element Resonators

Another implementation of a superconducting resonator is a lumped-element resonator. An advantage of a lumped-element resonator is that the current distribution can be substantially uniform along an inductive portion of the lumped-element resonator. Furthermore, a lumped-element resonator can be compact and, in at least some implementations, is not constrained to one octave of bandwidth. In an example implementation, a lumped element resonator can operate from 5 GHz to 15 GHz, and yield 10 GHz of bandwidth.

There are several constraints that can influence achievable electronic bandwidth utilization of a resonator-multiplexed programming system (also referred to in the present application as system bandwidth). The same or similar constraints can also influence the system bandwidth of implementations of superconducting resonators other than lumped-element resonators.

Firstly, system bandwidth can be constrained by cross-talk. The effective system bandwidth can be limited by as much as 30% in some implementations where resonances are spaced apart from each other to reduce cross-talk. The spacing between resonances can be several linewidths. In an example implementation, the system bandwidth is 4-8 GHz, and the per-resonator bandwidth is approximately 30 MHz centered on a resonant frequency within the system bandwidth.

Secondly, variations in fabrication, such as variations in layer thickness, can shift a resonant frequency by as much as 10% in some implementations.

Thirdly, layout of resonators and associated wiring can cause resonator-to-resonator frequency shifts. In some implementations, resonator bodies are routed in a single wiring layer to reduce resonator-to-resonator frequency shifts. In some implementations, where vias are used, an array of resonators can use the same number of vias with approximately the same distribution along the resonator length for every resonator in the array, to avoid or at least reduce differential changes in resonator lengths, resonator-to-resonator frequency shifts, and contaminant electronic cross-talk.

Fourthly, a higher-frequency resonator can be shorter than a lower-frequency resonator, and, in some instances, can become too short to span a width of a processor in which an array of resonators is used for DAC addressing. The constraint can be mitigated in some implementations by using a thin dielectric layer in the fabrication of parallel-plate capacitors in the resonators to reduce the footprint of the capacitors. See for example U.S. Provisional Patent Application Ser. No. 62/660,719, "SYSTEMS AND METHODS FOR FABRICATION OF SUPERCONDUCTING DEVICES", filed Apr. 20, 2018, and U.S. patent application Ser. No. 16/389,669, "SYSTEMS AND METHODS FOR FABRICATION OF SUPERCONDUCTING DEVICES".

A superconducting integrated circuit may include a substrate; a base electrode overlying at least a portion of the substrate, the base electrode superconductive in a range of temperatures; a parallel-plate capacitor overlying at least a portion of the base electrode, the parallel-plate capacitor comprising: a first capacitor plate that is superconductive in a range of temperatures; a metal-oxide layer overlying the first capacitor plate; a second capacitor plate overlying the metal-oxide layer, the second capacitor plate superconductive in a range of temperatures, wherein the base electrode is superconductingly electrically coupled to the first capacitor plate.

A method of fabricating a parallel-plate capacitor in a superconducting integrated circuit may include forming a metal-oxide layer to overlie at least a portion of a first capacitor plate, the first capacitor plate comprising a material that is superconductive in a range of temperatures; depositing a second capacitor plate to overlie at least a portion of the metal-oxide layer, the second capacitor plate comprising a material that is superconductive in a range of temperatures; depositing a base electrode to overlie at least a portion of a substrate, the base electrode comprising a material that is superconductive in a range of temperatures; depositing the first capacitor plate to overlie at least a portion of the base electrode, the first capacitor plate superconductingly electrically coupled to the base electrode; and depositing a counter electrode to overlie at least a portion of the second capacitor plate, the counter electrode comprising a material that is superconductive in a range of temperatures, wherein the counter electrode is superconductingly electrically coupled to the second capacitor plate.

In some implementations, a kinetic-inductance transmission line is used to route microwave signals with high isolation within the processor fabric using three layers or less. See, for example, PCT Patent Application No. WO2018US016237, SYSTEMS AND METHODS FOR FABRICATION OF SUPERCONDUCTING INTEGRATED CIRCUITS, filed Jan. 31, 2018. On-chip transmission lines are ideally designed to be fully enclosed (except at the point of coupling) and 50 ohm matched. Impedance matching ensures that minimal, or at least reduced, signal distortion occurs. Enclosing the transmission line ensures minimal, or at least reduced, coupling to box modes or on-chip structures. Additionally, the shield enclosing the transmission line can at least partially isolate an on-chip device (for example, a qubit) from high-frequency noise propagating on the line.

There can be challenges in implementing a 50 ohm transmission line in a 3-layer (or higher) superconducting integrated circuit. For example, there can be an undesirably large capacitance between the center line and the ground in a fabrication stack, in particular where the dielectric thickness is low and the wire width is too large. A higher capacitance can result in a lower characteristic impedance.

Some implementations include a transmission line with a center conductor having a large kinetic inductance. For example, the center conductor of the transmission line can include titanium nitride (TiN). A higher inductance of the center line can compensate for a higher capacitance between the center line and ground. This approach can be used to form a fully-enclosed, 50 ohm transmission line in as few as three metal layers in the fabrication stack.

A method for fabricating a superconducting integrated circuit may include depositing a first superconducting metal layer to overlie at least a portion of a substrate; depositing a first dielectric layer to overlie at least a portion of the first superconducting metal layer; and depositing a kinetic inductance layer to overlie at least a portion of the first dielectric layer, wherein the kinetic inductance layer forms a center conductor for an on-chip transmission line. The method may further include depositing a passivation layer to overlie at least a portion of the kinetic inductance layer. In some implementations, the method further includes depositing a second superconducting metal layer to overlie at least a portion of the passivation layer; depositing a second dielectric layer to overlie at least a portion of the second superconducting metal layer; and depositing a third superconducting metal layer to overlie at least a portion of the second dielectric layer, wherein the first and the third superconducting metal layers form an outer conductor of the on-chip transmission line. In some implementations, the method further includes depositing a second dielectric layer to overlie at least a portion of the passivation layer; and depositing a second superconducting metal layer to overlie at least a portion of the second dielectric layer, wherein the first and the second superconducting metal layers form an outer conductor of the on-chip transmission line.

High-Bandwidth Lines

FIG. 1 is a schematic diagram illustrating an example implementation of a microwave path 100 to a superconducting circuit, according to the present disclosure. Microwave path 100 is positioned in a cryogenic refrigeration system. The cryogenic refrigeration system includes a still 102, a sample holder 104, and mixing chamber 106. Microwave path 100 travels between still 102 and sample holder 104. Microwave path 100 is a microwave path through the cryogenic refrigeration system. Still 102, sample holder 104, and mixing chamber 106 are shown as dashed lines in FIG. 1 to provide context for microwave path 100.

Sample holder 104 can contain or hold the superconducting circuit. In some implementations, the superconducting circuit is an integrated superconducting circuit. In some implementations, the integrated superconducting circuit includes a quantum processor. In some implementations, the quantum processor includes a plurality of superconducting flux qubits. See, for example, PCT Patent Application No. PCT/US2009/055939 (published as International patent application publication WO 2010/028183A2), SYSTEMS, METHODS AND APPARATUS FOR ACTIVE COMPENSATION OF QUANTUM PROCESSOR ELEMENTS, filed Sep. 3, 2009.

Microwave path 100 traverses mixing chamber 106. Microwave path 100 includes a superconducting coaxial cable 108 between still 102 and mixing chamber 106. In some implementations, superconducting cable 108 is superconducting NbTi (niobium titanium) coaxial cable.

Microwave path 100 includes a bandpass filter 110, a powder filter 112, and a switch 114 for the operating band. In some implementations, powder filter 112 is a superconducting powder filter. Bandpass filter 110 is communicatively coupled to powder filter 112 by a coaxial cable 116. In some implementations, bandpass filter 110 is a GHz bandpass filter with greater than 90 dB out-of-band suppression of frequencies below 60 GHz. Bandpass filter 110 and powder filter 112 in combination can determine at least in part the filtering of signals on microwave path 100. The use of one or both of bandpass filter 110 and powder filter 112 can be optional in some implementations. One reason for including filters is to reduce noise on high-bandwidth lines used for programming devices such as devices in a quantum processor.

Figure 11:
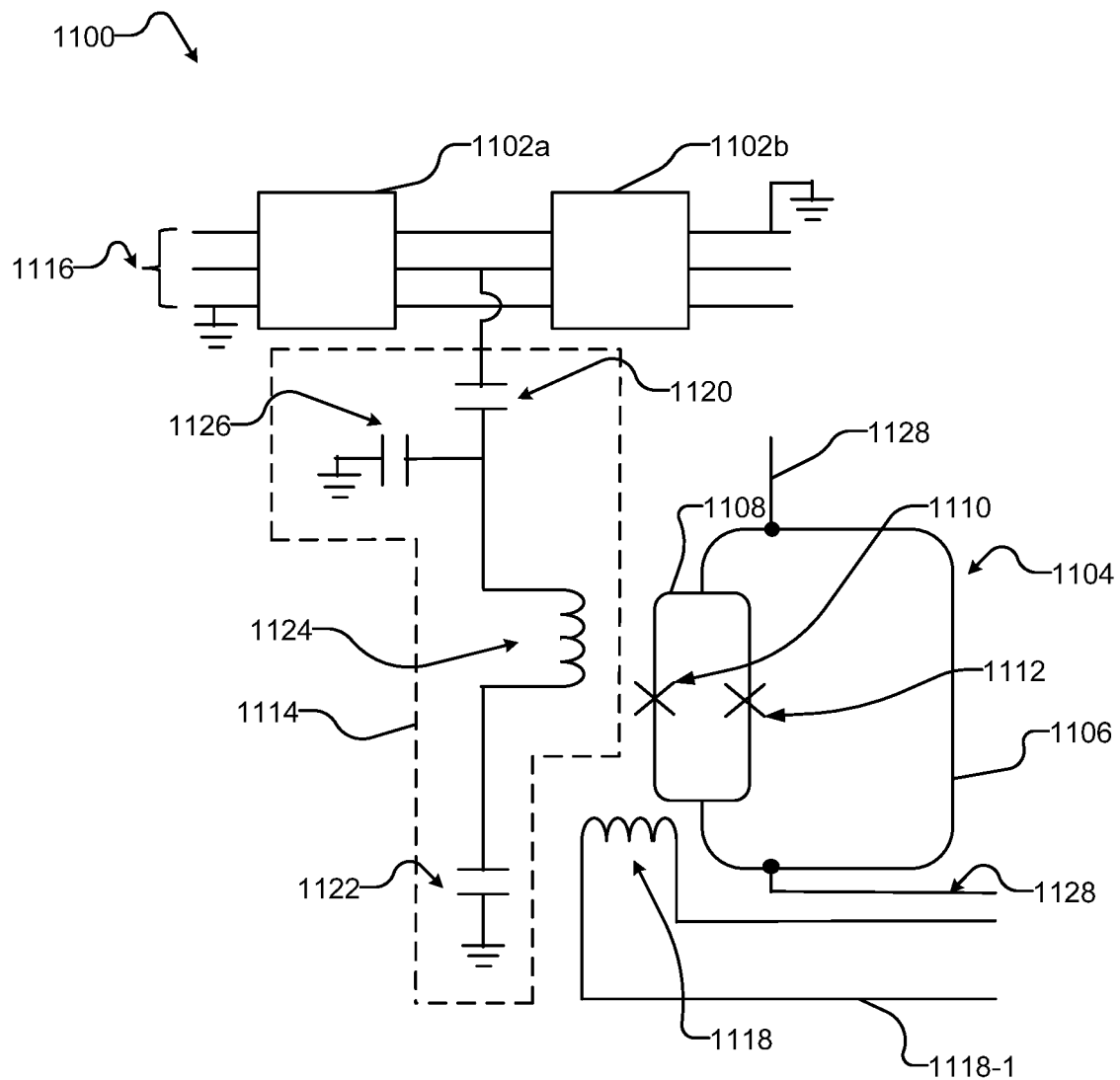
FIG. 11 is a schematic diagram illustrating an example implementation of a superconducting circuit that includes a switch, according to the present disclosure.
Figure 12:
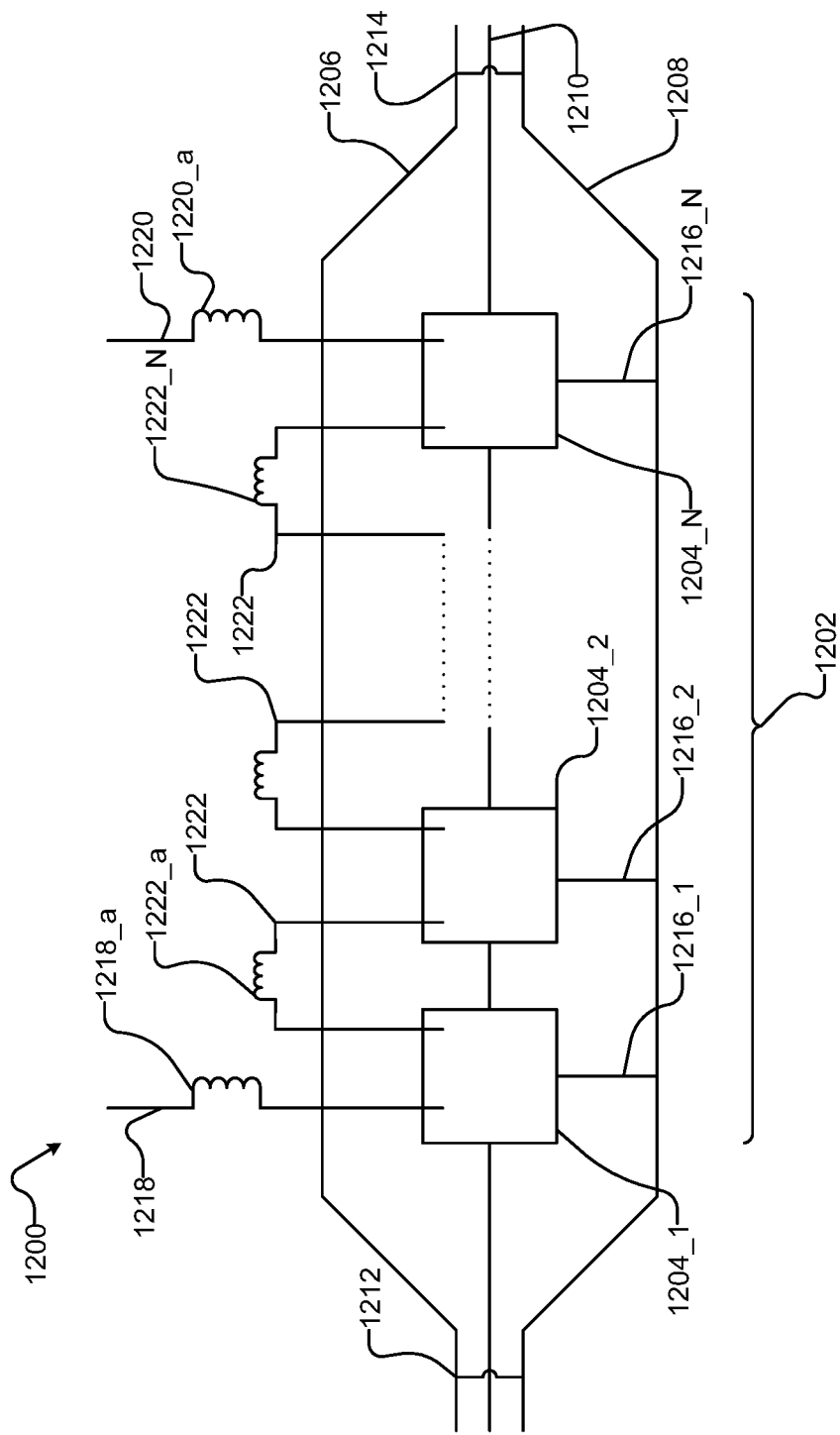
FIG. 12 is a schematic diagram of an example implementation of a transmission line layout with N cascade elements, according to the present disclosure.
Figure 13:
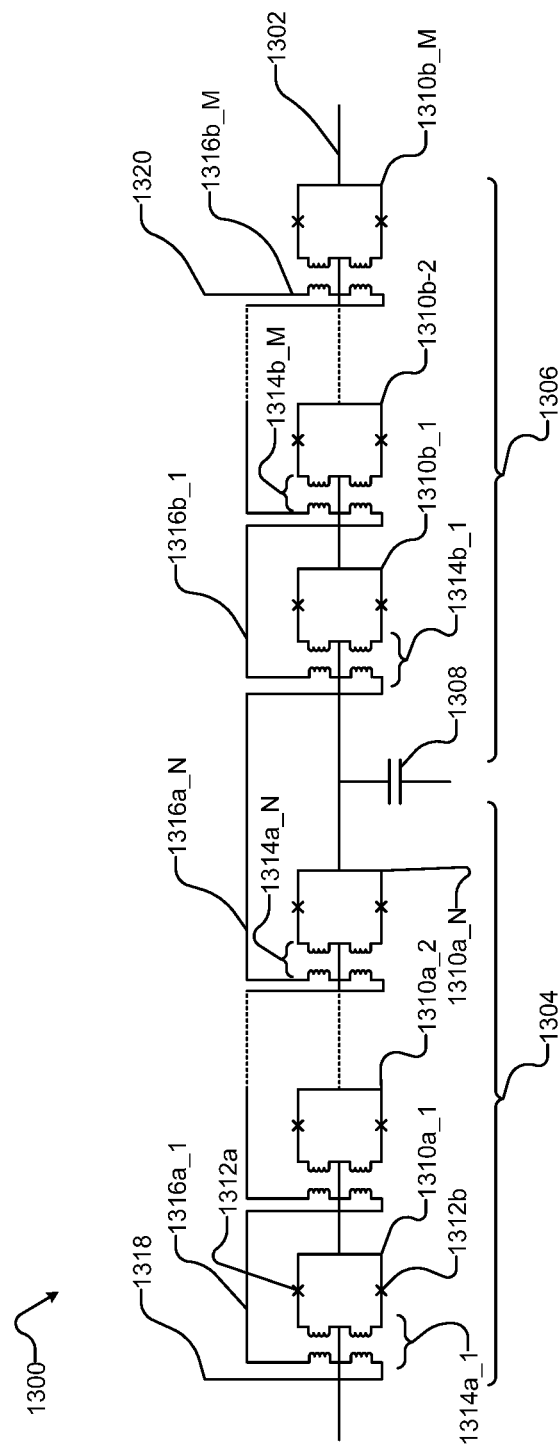
FIG. 13 is a schematic diagram of an example implementation of a single cascade element, according to the present disclosure.

In some implementations operating at a temperature of approximately 4 K (Kelvin), switch 114 is a CMOS (Complementary Metal-Oxide-Semiconductor) switch. In other implementations operating at a temperature of approximately 4 K, switch 114 is a superconducting switch, e.g., a cryotron. In some implementations operating at a temperature of approximately 10 mK, switch 114 is a superconducting switch, e.g., a cryotron. In yet other implementations, switch 114 is a broadband switch as described in the present application with reference to FIGS. 11, 12, and 13. The broadband switch of FIGS. 11, 12, and 13 is further described in U.S. patent application Ser. No. 16/397,790, DYNAMICAL ISOLATION OF A CRYOGENIC PROCESSOR, filed Apr. 29, 2019.

In some implementations, coaxial cable 116 is a copper coaxial cable. Powder filter 112 is communicatively coupled to switch 114 by coaxial cable 118. In some implementations, coaxial cable 118 is a copper coaxial cable. Switch 114 is communicatively coupled to sample holder 104 by coaxial cable 120. In some implementations, coaxial cable 120 is a copper coaxial cable.

Figure 2:
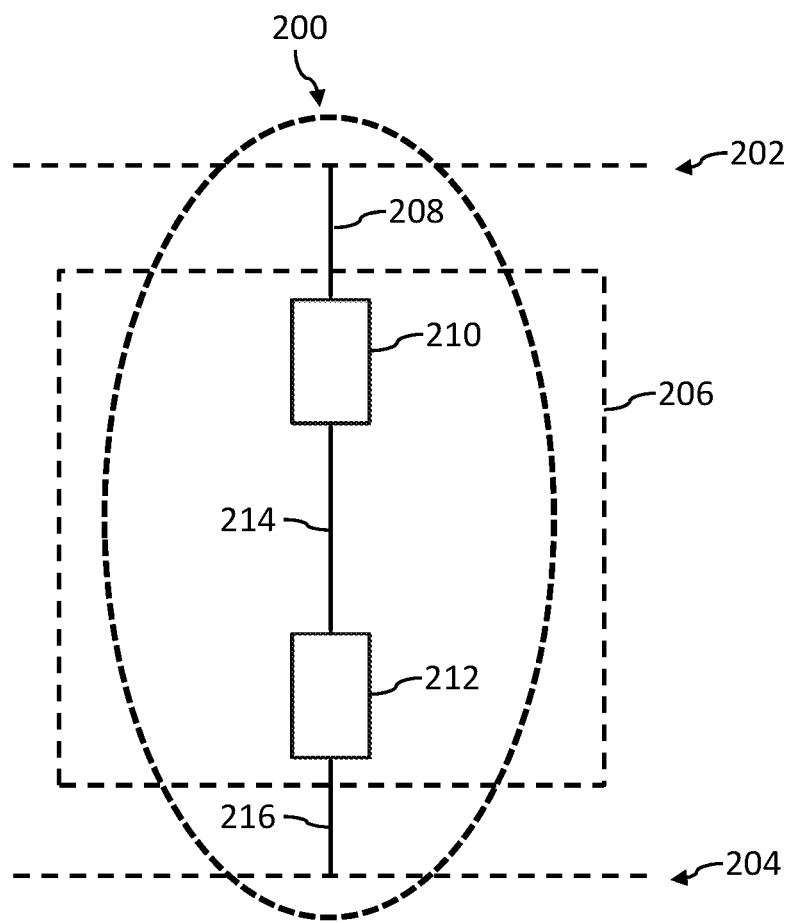
FIG. 2 is a schematic diagram illustrating another example implementation of a microwave path to a superconducting circuit, according to the present disclosure.

FIG. 2 is a schematic diagram illustrating another example implementation of a microwave path to a superconducting circuit, according to the present disclosure. Microwave path 200 is positioned in a cryogenic refrigeration system. The cryogenic refrigeration system includes a still 202, a sample holder 204, and a mixing chamber 206. Microwave path 200 travels between still 202 and sample holder 204. Microwave path 200 is a microwave path through the cryogenic refrigeration system. Still 202, sample holder 204, and mixing chamber 206 are shown as dashed lines in FIG. 2 to provide context for microwave path 200.

Sample holder 204 can contain or hold the superconducting circuit. In some implementations, the superconducting circuit is an integrated superconducting circuit. The integrated superconducting circuit may comprise or include a quantum processor with one or more other superconducting processors or devices, or may consist of a quantum processor. In some implementations, the quantum processor includes a plurality of superconducting flux qubits.

Microwave path 200 traverses mixing chamber 206. Microwave path 200 includes a coaxial cable 208 between still 202 and mixing chamber 206. In some implementations, coaxial cable 208 is a superconducting coaxial cable. In some implementations, coaxial cable is a stainless steel coaxial cable.

Microwave path 200 includes a bandpass filter 210 and a switch 212. Bandpass filter 210 is communicatively coupled to switch 212 by a coaxial cable 214. In some implementations, bandpass filter 210 is a GHz bandpass filter with greater than 90 dB out-of-band suppression of frequencies below 60 GHz. In some implementations, coaxial cable 214 is a copper coaxial cable. Switch 212 is communicatively coupled to sample holder 204 by coaxial cable 216. In some implementations, coaxial cable 216 is a copper coaxial cable.

In some implementations operating at a temperature of approximately 4 K, switch 212 is a CMOS switch. In other implementations operating at a temperature of approximately 4 K, switch 212 is a superconducting switch, e.g., a cryotron. In some implementations operating at a temperature of approximately 10 mK, switch 212 is a superconducting switch, e.g., a cryotron. In yet other implementations, switch 212 is a broadband switch as described in the present application with reference to FIGS. 11, 12, and 13.

Example Lumped-Element Resonators

Figure 3A:
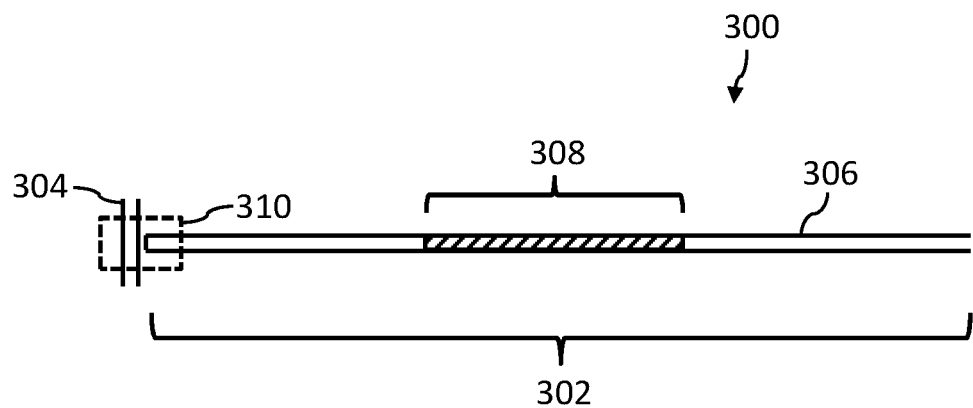
FIG. 3A is a schematic layout of a portion of an example implementation of a superconducting circuit that includes a superconducting half-wave resonator and a transmission line, according to the present disclosure.

FIG. 3A is a schematic layout of a portion of an example implementation of a superconducting circuit 300 that includes a superconducting half-wave resonator 302 and a transmission line 304, according to the present disclosure. For example, superconducting half-wave resonator 302 can be a microstrip resonator, a coplanar waveguide (CPW) resonator, or a lumped-element resonator. For example, transmission line 304 can be a microstrip transmission line, a CPW transmission line, or a coaxial transmission line.

Superconducting half-wave resonator 302 includes a resonator body 306. FIG. 3A illustrates a portion of resonator body 306. In one implementation, resonator body 306 is 7 mm in length.

Region 308 (shown in FIG. 3A by hatching) is a region over which a current in resonator body 306 is within a suitable threshold of a maximum current. In some implementations, the suitable threshold is 90% of the maximum current. In some implementations, one portion of a length of resonator body 306 is used for coupling to a DAC, and another portion of the length is serpentine, e.g., to increase compactness of superconducting half-wave resonator 302.

Figure 3B:
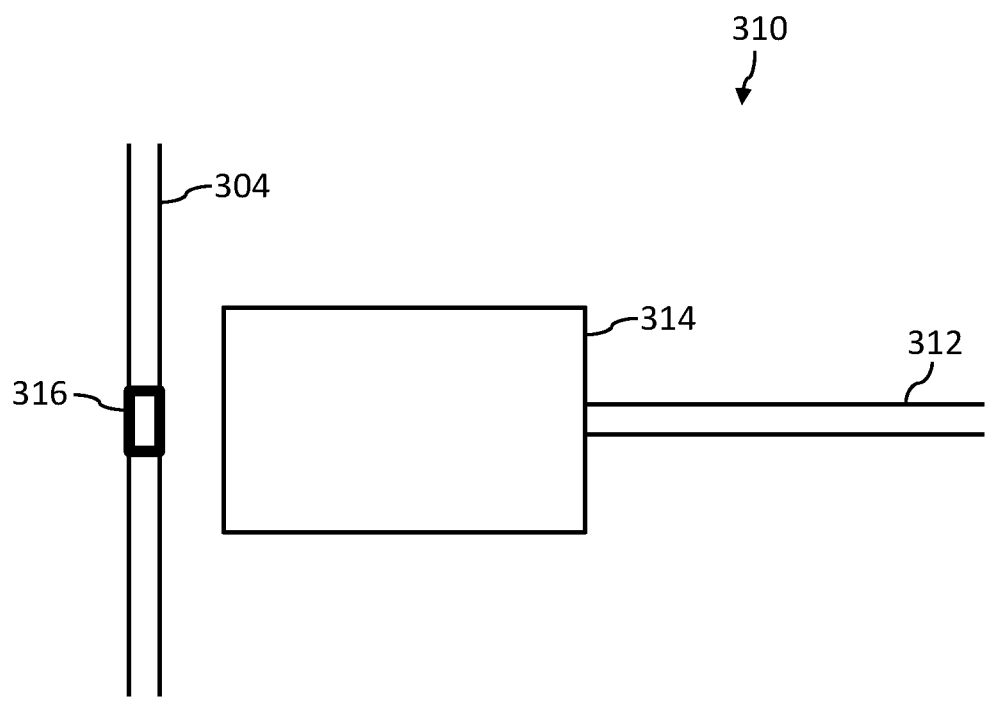
FIG. 3B is an enlarged view of a coupling region of the superconducting half-wave resonator of FIG. 3A.

FIG. 3B is an enlarged view of a coupling region 310 of superconducting half-wave resonator 302 of FIG. 3A. Superconducting half-wave resonator 302 includes wiring 312 and a coupling capacitor 314. In some implementations, coupling capacitor 314 is a parallel-plate capacitor. In some implementations, coupling capacitor 314 includes a thin-film metal-oxide layer as a dielectric in the parallel-plate capacitor. See for example U.S. Provisional Patent Application Ser. No. 62/660,719, "SYSTEMS AND METHODS FOR FABRICATION OF SUPERCONDUCTING DEVICES", filed Apr. 20, 2018, and U.S. patent application Ser. No. 16/389,669, "SYSTEMS AND METHODS FOR FABRICATION OF SUPERCONDUCTING DEVICES". In one implementation, coupling capacitor 314 has dimensions of 30 µm×20 µm.

Superconducting circuit 300 includes a via 316, for example to provide a superconducting communicative coupling between transmission line 304 and a lower capacitor plate of coupling capacitor 314. The lower capacitor plate of coupling capacitor 314 is not shown in FIG. 3B. A via is also referred to in the present application as a VIA and a vertical interconnect access. A via is an electrical communicative coupling between layers in an electronic circuit. The via may pass through a plane of one or more adjacent layers. The electronic circuit may be an integrated circuit. The electronic circuit may be a printed circuit board. A superconducting via is a superconducting electrical communicative coupling between layers in a superconducting electronic circuit.

Superconducting half-wave resonator 302 can have a symmetric coupling to ground at the other end. The ground is also referred to in the present application as an electrical ground. The ground is not shown in FIGS. 3A and 3B. In some implementations, wiring 312 and/or transmission line 304 include 2 µm lines over a 1 µm silicon dioxide (SiO2) dielectric, which can provide an impedance close to 50Ω. In one implementation, superconducting half-wave resonator 302 has a resonance at 9.58 GHz with approximately 35 MHz of bandwidth.

Figure 4A:
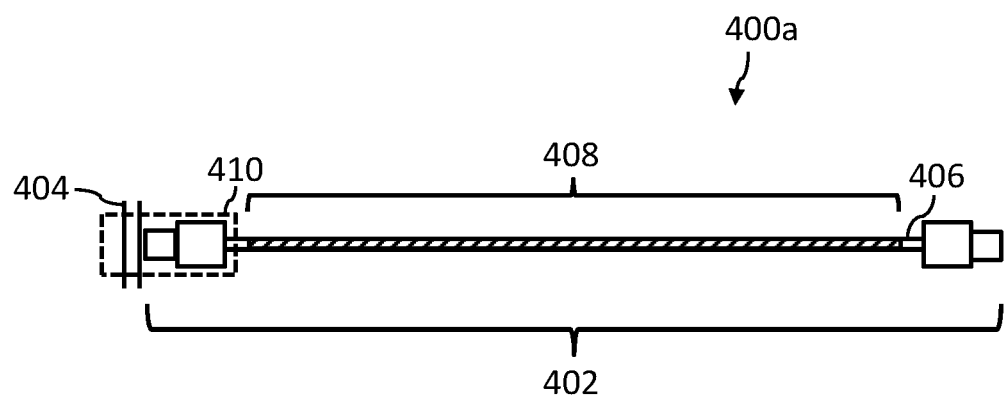
FIG. 4A is a schematic layout of a portion of an example implementation of a superconducting circuit that includes a superconducting lumped-element resonator and a transmission line, according to the present disclosure.

FIG. 4A is a schematic layout of a portion of an example implementation of a superconducting circuit 400a that includes a superconducting lumped-element resonator 402 and a transmission line 404, according to the present disclosure. Superconducting lumped-element resonator 402 includes a resonator body 406.

Region 408 (shown in FIG. 4A by hatching) is a region over which a current in resonator body 406 is within a suitable threshold of a maximum current. In some implementations, the suitable threshold is 90% of the maximum current.

Figure 4B:
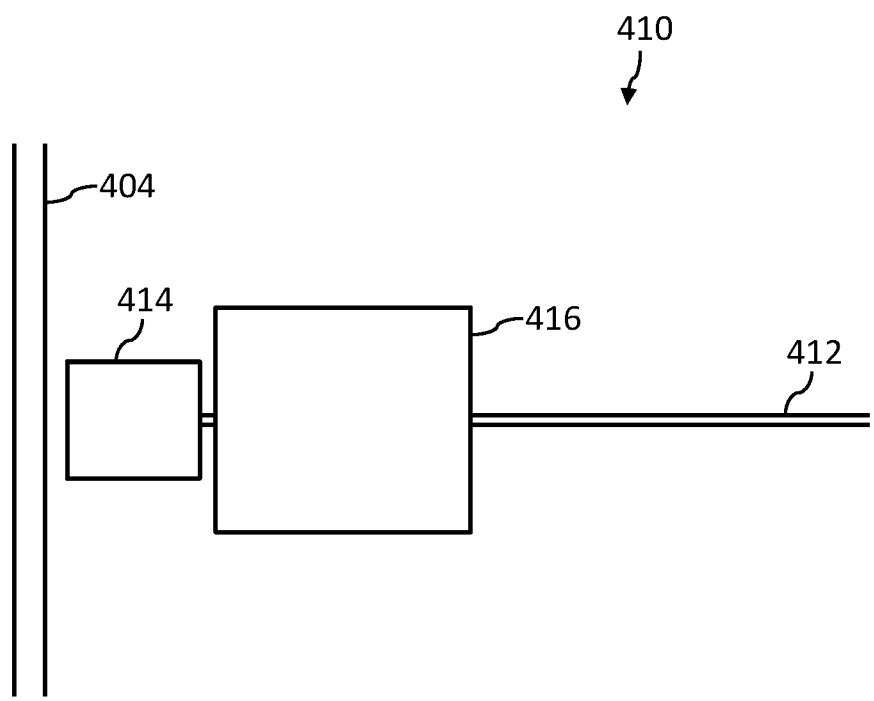
FIG. 4B is an enlarged view of a coupling region of the superconducting lumped-element resonator of FIG. 4A.

FIG. 4B is an enlarged view of a coupling region 410 of superconducting lumped-element resonator 402 of FIG. 4A. Superconducting lumped-element resonator 402 includes wiring 412, a coupling capacitor 414, and a shunting capacitor 416. In some implementations, coupling capacitor 414 is a parallel-plate capacitor. In some implementations, coupling capacitor 414 includes a thin-film metal-oxide layer for a dielectric in the parallel-plate capacitor. In one implementation, coupling capacitor 414 has dimensions of 30 µm×30 µm. In one implementation, shunting capacitor 416 has dimensions 100 µm×120 µm.

Superconducting lumped-element resonator 402 can have a symmetric coupling to ground at the other end. In some implementations, wiring 412 and/or transmission line 404 include 2 µm lines over a 1 µm silicon dioxide (SiO2) dielectric, which can provide an impedance close to 50Ω. In one implementation, superconducting lumped-element resonator 402 has a resonance at 9.62 GHz with approximately 30 MHz of bandwidth.

Figure 4C:
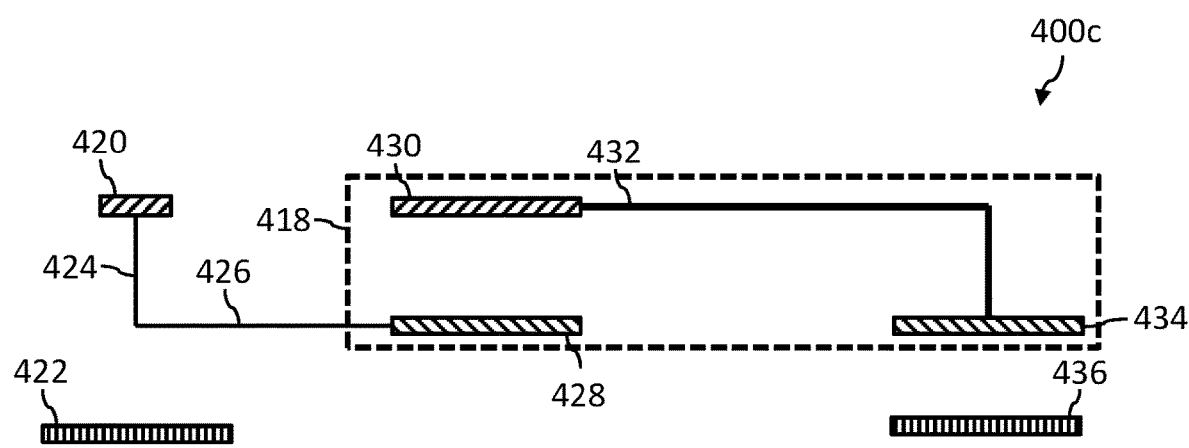
FIG. 4C is a cross-section of a portion of an example implementation of a superconducting circuit that includes a superconducting lumped-element resonator and a transmission line, according to the present disclosure.

FIG. 4C is a schematic drawing of a cross-section of a portion of an example implementation of a superconducting circuit 400c that includes a superconducting lumped-element resonator 418 and a transmission line 420, according to the present disclosure.

Superconducting circuit 400c is implemented in a multi-layer superconducting integrated circuit. Transmission line 420 is coupled to a ground plane 422. Transmission line 420 is superconductingly communicatively coupled by a superconducting via 424 and superconducting wiring 426 to a lower plate 428 of a coupling capacitor (such as coupling capacitor 414 of FIG. 4B).

An upper plate 430 of the coupling capacitor is superconductingly communicatively coupled to a resonator body 432 and an upper plate 434 of a capacitor coupling superconducting lumped-element resonator 418 to a ground plane 436.

Resonator-Addressed DAC

Resonator-addressing of a superconducting digital-to-analog converter (DAC) can use the DAC in operation to perform latching. Resonator-addressing is also referred to in the present application as resonator-loading of a DAC. A resonator can be integrated with a DAC, and can, for example, be used to replace an ADDR line and/or a TRIG line.

The superconducting DAC is a flux memory or flux storage device. The DAC can convert a digital amount of flux into flux stored in an analog device.

In some implementations, the DAC includes a loop of material that is superconducting in a range of temperatures, the loop interrupted by one or more Josephson junctions. In one implementation, the DAC is an rf-SQUID (radio-frequency superconducting quantum interference device) and includes a superconducting loop interrupted by a single Josephson junction. In another implementation, the DAC is a superconducting loop interrupted by a compound Josephson junction (CJJ). A CJJ includes two parallel current paths each interrupted by a Josephson junction. The DAC CJJ loop can behave as a summing element for magnetic flux. The loop can combine a direct current (DC) provided by a wire (e.g., a twisted-pair) with a current induced by a resonator. In some implementations, the wire is shared globally, i.e., shared by multiple DACs in the processor, and the wire can provide a global bias signal.

Storing flux in the DAC includes adding flux to the CJJ loop of the DAC, and moving flux in the CJJ loop of the DAC into the storage loop of the DAC (i.e., into the superconducting loop of the DAC). Flux can be added to the CJJ loop of the superconducting DAC by suppressing a Josephson junction in the CJJ using one or more control signals or biases. Flux can be moved into the DAC storage loop by suppressing another Josephson junction in the CJJ loop using one or more control signals or biases. Multiple flux quanta can be stored in a superconducting DAC implemented using a CJJ loop.

See, for example, Johnson M. W. et al. "A scalable control system for a superconducting adiabatic quantum optimization processor", arXiv:0907.3757v2, 24 Mar. 2010 for a description of an example implementation of flux DACs operable to control superconducting devices in an integrated circuit.

An array of resonators can be used to provide one or more signals that can be combined with the global bias signal to enable addressing of DACs.

Figure 5A:
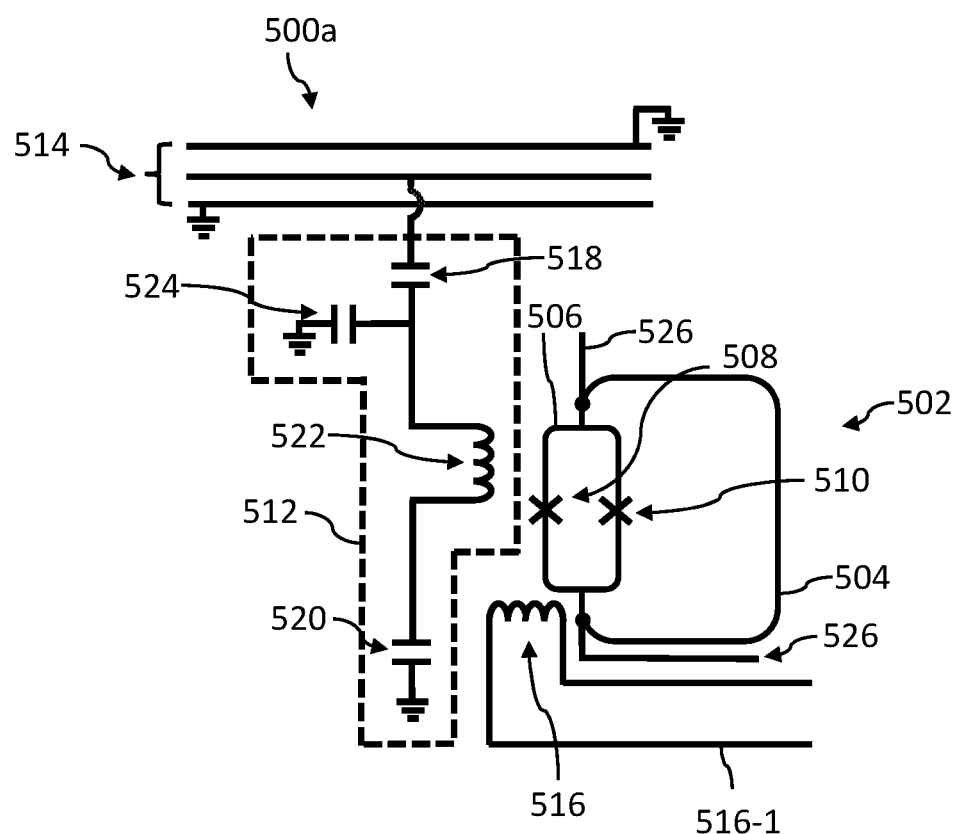
FIG. 5A is a schematic diagram illustrating an example implementation of a superconducting circuit that includes a resonator-addressed digital-to-analog converter (DAC), according to the present disclosure.

FIG. 5A is a schematic diagram illustrating an example implementation of a superconducting circuit 500a that includes a resonator-addressed DAC 502, according to the present disclosure.

In superconducting circuit 500a, resonator-addressed DAC 502 includes a loop 504 of material that is superconductive in a range of temperatures, and a CJJ 506. CJJ 506 includes two parallel current paths each interrupted by a Josephson junction, Josephson junctions 508 and 510, respectively.

Superconducting circuit 500a further includes a resonator 512, a transmission line 514, and interface 516 operable to provide a global flux bias by a global flux bias line 516-1. Resonator 512 includes coupling capacitors 518 and 520, an inductive interface 522 to resonator-addressed DAC 502, and an optional shunting capacitor 524. The term "inductive interface" is also referred to in the present application as a coupling inductance. Coupling inductance 522, for example, inductively communicatively couples resonator 512 and resonator-addressed DAC 502.

Superconducting circuit 500a further includes a current bias line 526 operable to provide a current bias to resonator-addressed DAC 502.

Figure 5B:
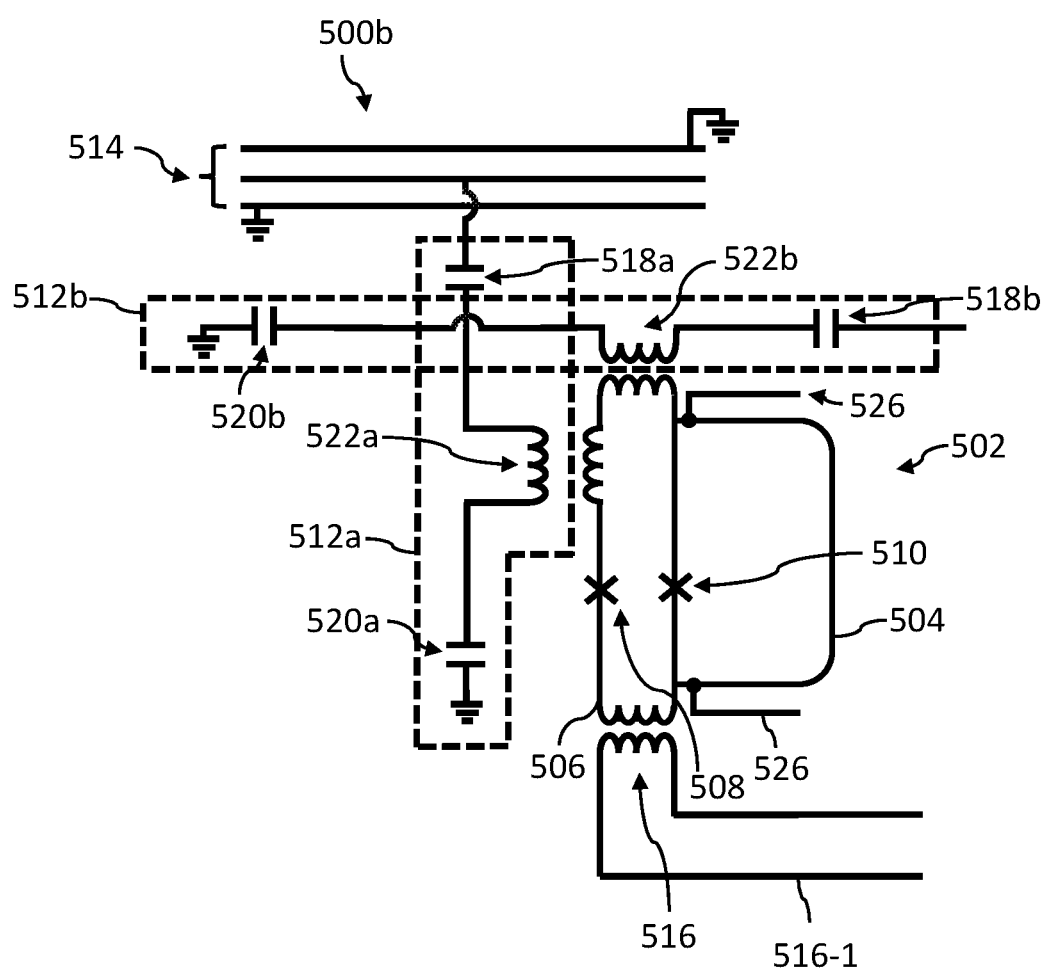
FIG. 5B is a schematic diagram illustrating another example implementation of a superconducting circuit that includes a resonator-addressed digital-to-analog converter (DAC), according to the present disclosure.

In some implementations, multiple resonators are coupled to a single DAC CJJ loop. FIG. 5B is a schematic diagram illustrating another example implementation of a superconducting circuit 500b that includes a resonator-addressed digital-to-analog converter (DAC) 502, according to the present disclosure.

In FIG. 5B, the same reference numbers as used in FIG. 5A are used in FIG. 5B to denote the same or similar elements. In instances where there is more than one of a given element in the implementation of FIG. 5B, the reference number has a suffix, for example "a" or "b".

In superconducting circuit 500b, resonator-addressed DAC 502 includes a loop 504 of material that is superconductive in a range of temperatures, and a CJJ 506. CJJ 506 includes two parallel current paths each interrupted by a Josephson junction, Josephson junctions 508 and 510, respectively.

Superconducting circuit 500b further includes a pair of resonators 512a and 512b, a transmission line 514, and interface 516 operable to provide a global flux bias by a global flux bias line 516-1. Resonator 512a includes coupling capacitors 518a and 520a, an inductive interface 522a to resonator-addressed DAC 502, and an optional shunting capacitor (not shown in FIG. 5B for clarity) like optional shunt capacitor 524 of FIG. 5A. Resonator 512b includes coupling capacitors 518b and 520b, an inductive interface 522b to resonator-addressed DAC 502, and an optional shunting capacitor (not shown in FIG. 5B for clarity) like optional shunt capacitor 524 of FIG. 5A.

Superconducting circuit 500b further includes a current bias line 526 operable to provide a current bias to resonator-addressed DAC 502.

In one implementation, resonators 512a and 512b are both coupled to transmission line 514. In another implementation, resonator 512a is coupled to transmission line 514, and resonator 512b is coupled to another transmission line (not shown in FIG. 5B).

In an example where two resonators are coupled to the same DAC CJJ loop, programming of the DAC can be achieved by having a low-frequency bias signal and two microwave signals combine constructively to exceed a determined address latching level. The arrangement can be used to construct an XY-addressing scheme for a set of DACs, for example as follows. Firstly, a DC current bias is applied to the DAC by a line referred to in the present application as a power line (PWR). Next, a global low-frequency bias address line (such global flux bias line 516-1 of FIGS. 5A and 5B) is coupled to each DAC CJJ loop of the set of DAC CJJ loops. Then, an array of resonators is laid out across the processor in a two-dimensional X-Y grid. Programming a selected DAC can be achieved by pre-biasing the set of DAC CJJ loops, and activating the two resonators (also referred to in the present application as the address and trigger resonators) that intersect at the selected DAC.

The selected DAC can be programmed when the two microwave tones (at frequencies $f_{lo}$ and $f_{hi}$ respectively) add constructively at the selected DAC. A relative phase between the two microwave tones can evolve at an angular frequency ω given by the following expression:

$$\omega=2\pi/(f_{hi}-f_{lo})$$

The higher frequency tone can advance by $\delta\theta=\omega/f_{lo}$ radians per cycle relative to the low frequency tone. Each time the low frequency tone is at a maximum, the high frequency tone can have advanced by an angle of dB. The angle δθ can represent the closest the maxima can approach within a cycle at the beat frequency, and, since the angle δθ can be linearly proportional to the beat frequency ω, it can be desirable to select a smaller beat frequency ω. On the other hand, the smaller the beat frequency ω, the longer it will take to complete a full 2π rotation.

It can be desirable to leave the resonator charged no more than a few multiples of $\tau=1/(2\pi\Delta f)$ where Δf is the bandwidth per tone (also referred to in the present application as a linewidth of the resonator). It can typically take a few multiples of τ to charge and discharge the resonator. Programming can be completed roughly on the same timescale for efficient bandwidth utilization. This suggests that it can be desirable to match the beat frequency to the linewidth of the resonator.

This leads to a criterion for completing the programming in a reasonable time—that the beat frequency should be approximately matched to a resonator linewidth (ω~2πΔf). This is consistent with a preference for resonances within a single array to be separated by a few linewidths Δf to avoid, or at least reduce, cross-talk between channels. With the beat frequency determined, the resonant frequencies can, in general, be selected to be at higher frequencies consistent with the determined beat frequency.

Figure 5C:
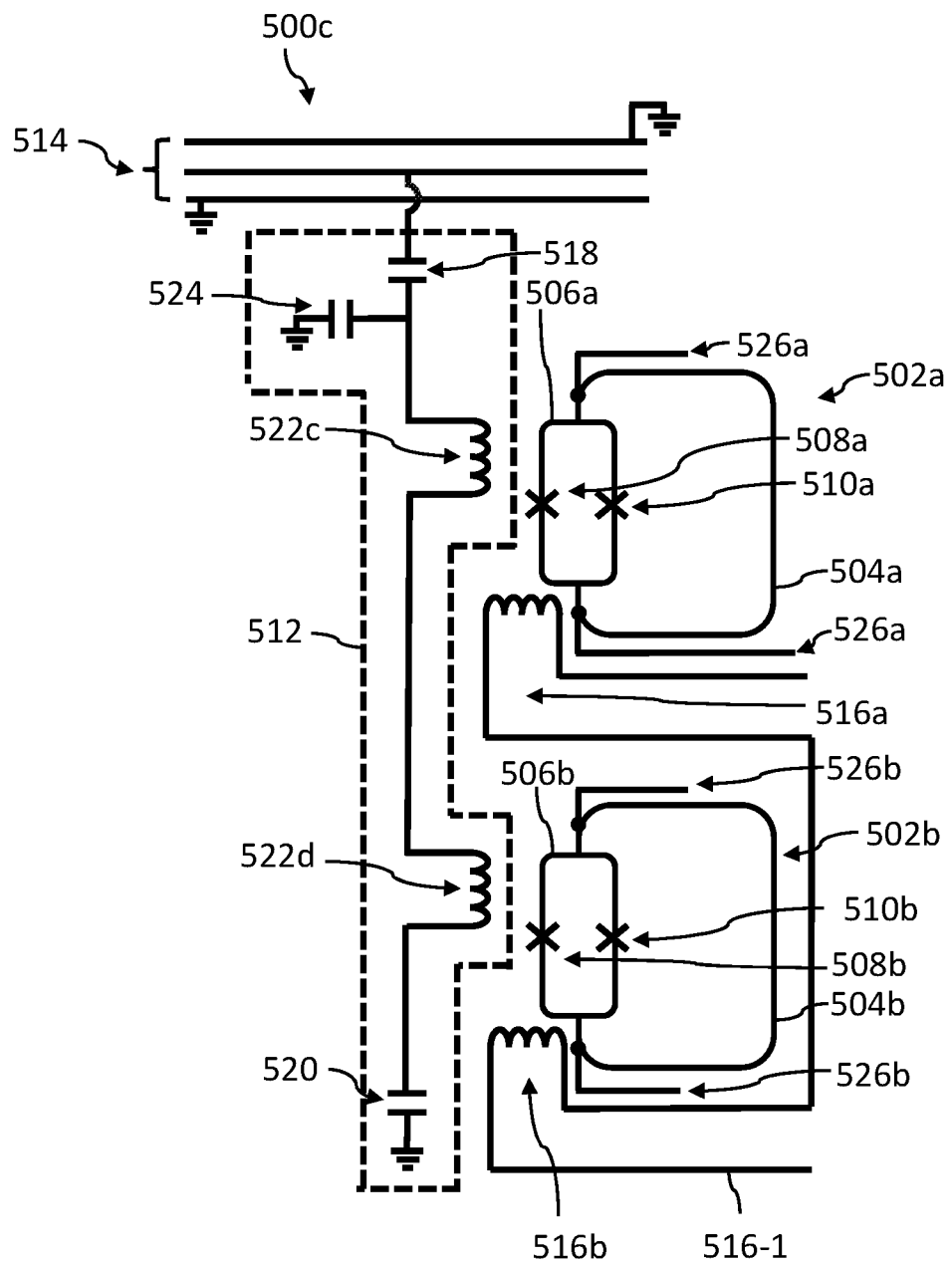
FIG. 5C is a schematic diagram illustrating an example implementation of a superconducting circuit that includes a pair of resonator-addressed digital-to-analog converters (DACs), according to the present disclosure.

FIG. 5C is a schematic diagram illustrating an example implementation of a superconducting circuit 500c that includes a pair of resonator-addressed digital-to-analog converters (DACs) 502a and 502b, according to the present disclosure.

The same reference numbers as used in FIG. 5A are used in FIG. 5C to denote the same or similar elements. In instances where there is more than one of a given element in the implementation of FIG. 5C, the reference number has a suffix, for example "a" or "b".

In superconducting circuit 500c, resonator-addressed DAC 502a includes a loop 504a of material that is superconductive in a range of temperatures, and a CJJ 506a. CJJ 506a includes two parallel current paths each interrupted by a Josephson junction, Josephson junctions 508a and 510a, respectively. Resonator-addressed DAC 502b includes a loop 504b of material that is superconductive in a range of temperatures, and a CJJ 506b. CJJ 506b includes two parallel current paths each interrupted by a Josephson junction, Josephson junctions 508b and 510b, respectively.

Superconducting circuit 500c further includes a resonator 512, a transmission line 514, and interfaces 516a, 516b operable to provide a global flux bias by a global flux bias line 516-1. Resonator 512 includes coupling capacitors 518 and 520, an inductive interface 522c to resonator-addressed DAC 502a, an inductive interface 522d to resonator-addressed DAC 502b, and an optional shunting capacitor 524.

Superconducting circuit 500c further includes a current bias line 526a operable to provide a current bias to resonator-addressed DAC 502a, and a current bias line 526b operable to provide a current bias to resonator-addressed DAC 502b.

A variation in current along the body of resonator 512 of FIG. 5C can be at least partially compensated for by tuning each coupling of resonator 512 to DAC CJJ loops 502a and 502b. In some implementations, resonator 512 can be coupled to more than two DAC CJJ loops (only two DAC CJJ loops are shown in FIG. 5C), and a variation in current along the body of resonator 512 can be at least partially compensated for by tuning each coupling of resonator 512 to a respective DAC CJJ loop.

Figure 5D:
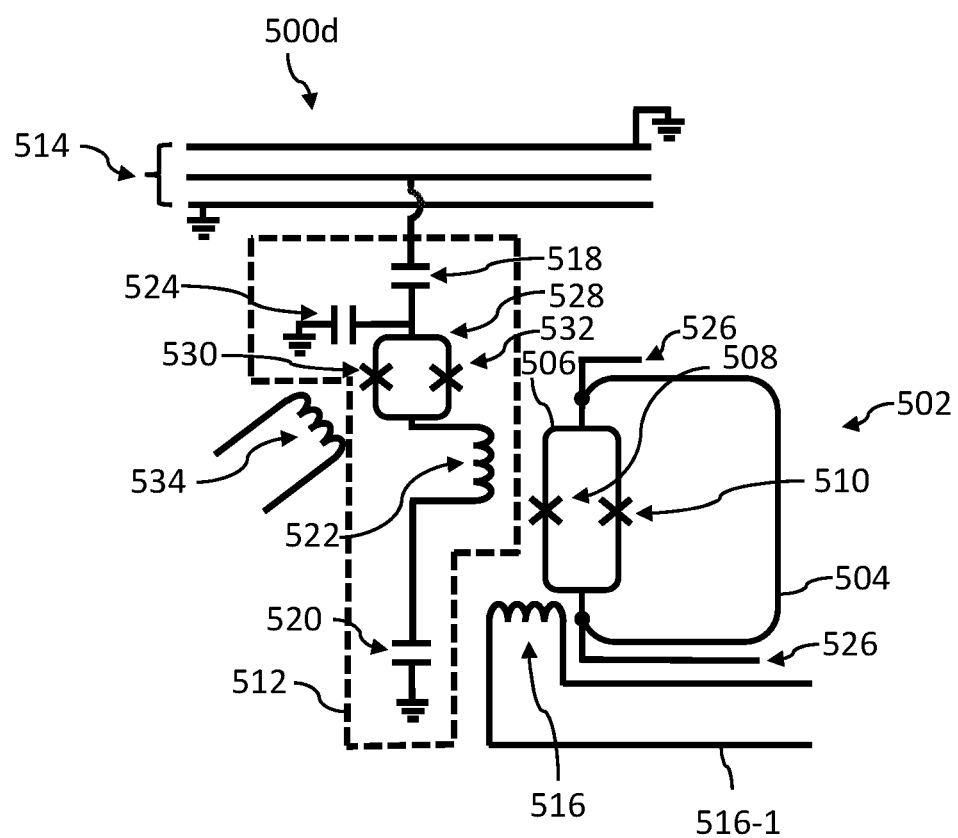
FIG. 5D is a schematic diagram illustrating another example implementation of a superconducting circuit that includes a resonator-addressed digital-to-analog converter (DAC), according to the present disclosure.

FIG. 5D is a schematic diagram illustrating another example implementation of a superconducting circuit 500d that includes a resonator-addressed digital-to-analog converter (DAC) 502, according to the present disclosure.

Resonator 512 of FIG. 5D includes a DC-SQUID (direct current superconducting quantum interference device) 528. DC-SQUID 528 includes a pair of Josephson junctions 530 and 532. Superconducting circuit 500*d* includes an interface 534. Interface 534 can be provided by a DAC or an analog line, for example. A resonant frequency of resonator 512 of FIG. 5D can be tuned by applying a flux bias to DC-SQUID 532 by interface 534.

In some implementations, a critical current of at least one of Josephson junctions 530 and 532 is comparable in magnitude to a current in resonator 512.

Instead of capacitively communicatively coupling resonator 512 of FIGS. 5A, 5C, and 5D to transmission line 514 by coupling capacitor 518, resonator 512 can be communicatively coupled to transmission line 514 by an inductive coupling. For example, resonator 512 can be inductively communicatively coupled to transmission line 514 by an inductive coupling to a portion of the body of resonator 512.

Similarly, instead of capacitively communicatively coupling each of resonators 512*a* and 512*b* of FIG. 5B to a respective transmission line by a respective coupling capacitor, at least one of resonators 512*a* and 512*b* can be inductively communicatively coupled to the respective transmission line by an inductive coupling to a portion of the body of the resonator.

Figure 5E:
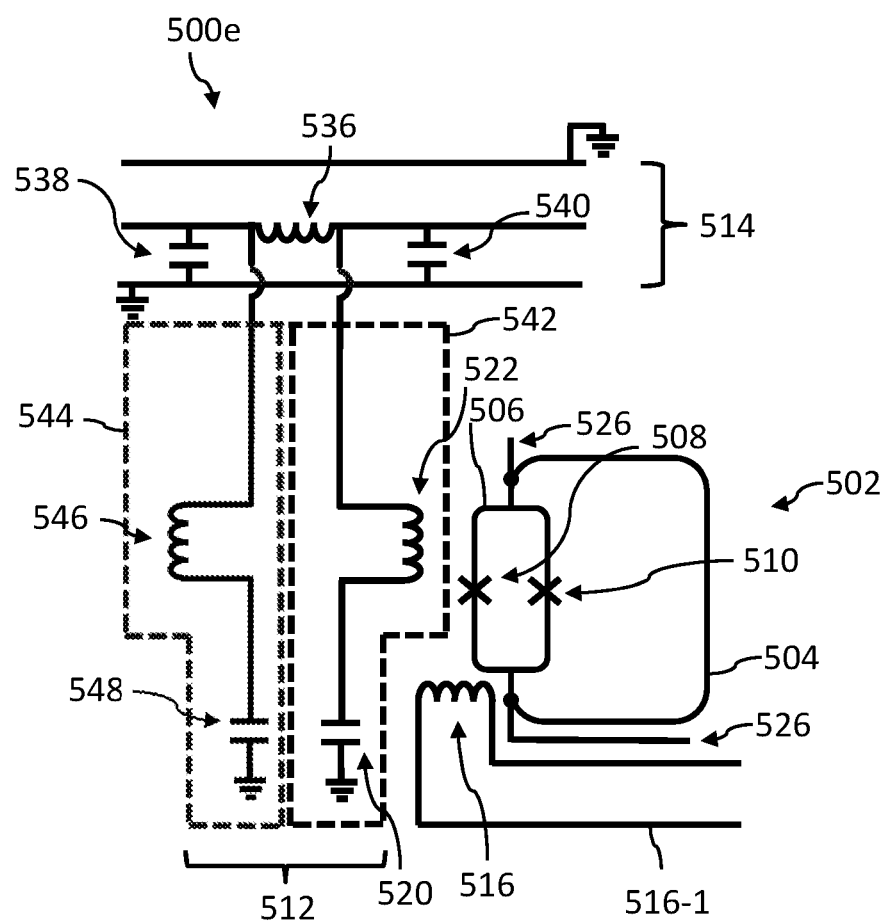
FIG. 5E is a schematic diagram illustrating an example implementation of a superconducting circuit that includes a resonator-addressed digital-to-analog converter (DAC), and a resonator that is inductively coupled to a transmission line, according to the present disclosure.

FIG. 5E is a schematic diagram illustrating an example implementation of a superconducting circuit 500*e* that includes a resonator-addressed digital-to-analog converter (DAC) 502, and a resonator 512 that is inductively coupled to transmission line 514, according to the present disclosure. The same reference numbers as used in FIG. 5A are used in FIG. 5E to denote the same or similar elements.

Superconducting circuit 500*e* includes a transmission line inductance 536, and matching capacitors 538 and 540. Matching capacitors 538 and 540 can at least partially tune an impedance of transmission line 514 (e.g. to cause the impedance of transmission line 514 to be approximately 50Ω).

Resonator 512 can be inductively communicatively coupled to transmission line 514 by a shared galvanic inductance 536. Resonator 512 can be used to address one or more DACs or other superconducting devices. Resonator 512 includes a first part 542 that includes an inductive interface 522 to resonator-addressed DAC 502, and a second part 544 that includes an inductive interface 546 to another resonator-addressed DAC (not shown in FIG. 5E). First part 542 includes a capacitor 520, and second part 544 includes a capacitor 548.

Figure 5F:
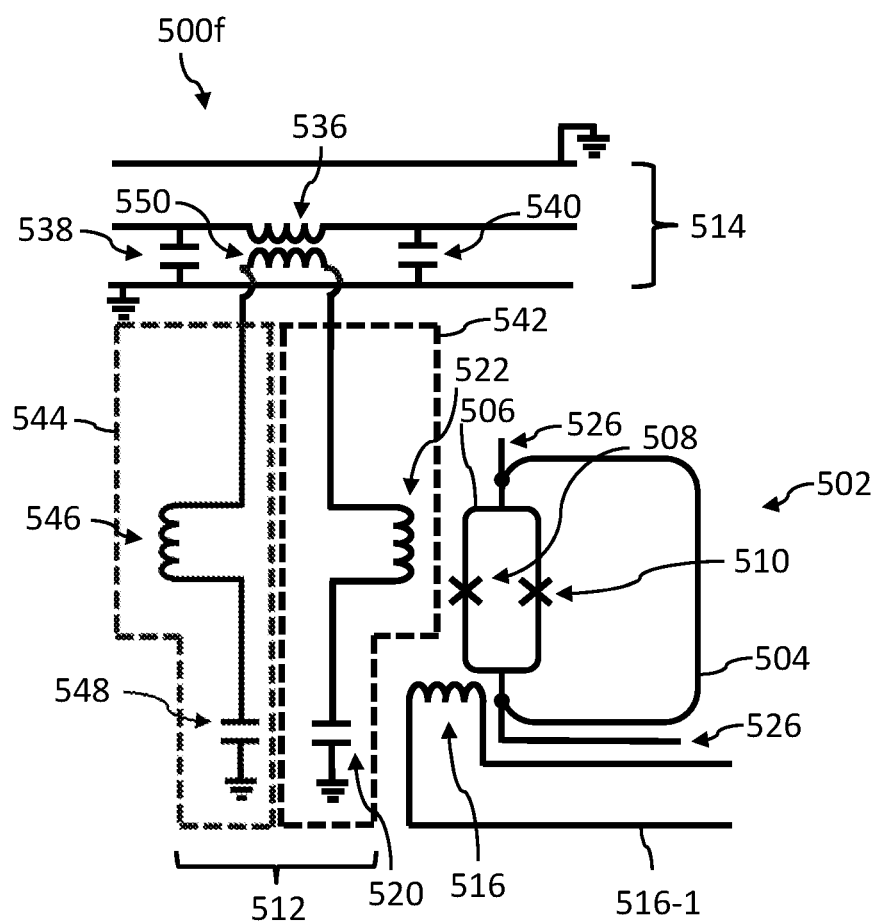
FIG. 5F is a schematic diagram illustrating another example implementation of a superconducting circuit that includes a resonator-addressed digital-to-analog converter (DAC), and a resonator that is inductively coupled to a transmission line, according to the present disclosure.

FIG. 5F is a schematic diagram illustrating another example implementation of a superconducting circuit 500*f* that includes a resonator-addressed digital-to-analog converter (DAC) 502, and a resonator 512 that is inductively coupled to transmission line 514, according to the present disclosure. The same reference numbers as used in FIG. 5A are used in FIG. 5F to denote the same or similar elements. Superconducting circuit 500*f* includes a coupling inductance 550 that can inductively communicatively couple resonator 512 to transmission line 514 by transmission line inductance 536. Coupling inductance 550 and transmission line inductance 536 form a magnetic transformer by which resonator 512 is inductively coupled to transmission line 514.

Figure 6:
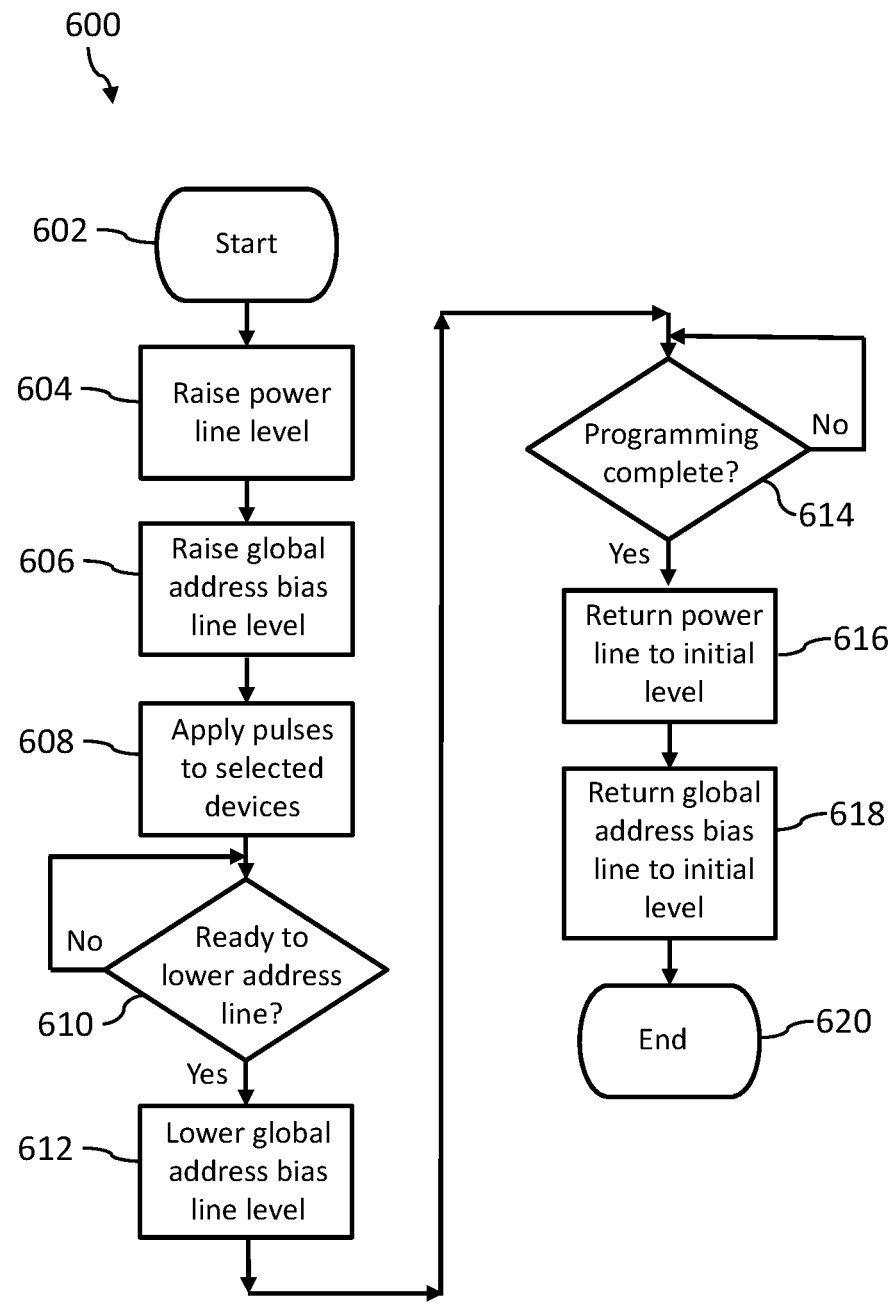
FIG. 6 is a flow chart illustrating an example method for programming a superconducting DAC, according to the present disclosure.

FIG. 6 is a flow chart illustrating an example method 600 for programming a DAC according to the present disclosure. FIG. 6 illustrates a sequence of currents used to load a single flux quantum into a DAC storage loop using standard 30 MHz lines, for example. Method 600 may be implemented by a programming system. For example, method 600 may be implemented by electronics, for example electronics operating at room temperature. In some implementations, the phases and amplitudes of the high-frequency tones are controllable, for example, by electronics operating at room temperature.

Method 600 includes acts 602 to 620, though those of skill in the art will appreciate that in alternative embodiments certain acts may be omitted and/or additional acts may be added. Those of skill in the art will appreciate that the illustrated order of the acts is shown for exemplary purposes only and may change in alterative embodiments.

Method 600 starts at 602, for example in response to an initiation of a programming of a DAC. At 604, the DAC power level in the current line to the resonator-addressed DAC (such as resonator-addressed DAC 502 of FIG. 5A) is raised to a pre-calibrated level or defined calibration level. At 606, the global address bias line is raised to a pre-calibrated level or defined calibration level, thereby applying a flux bias to one or more resonator-addressed DACs. The level can be calibrated to cause the level to cross a predetermined or defined upper threshold when high-frequency microwave pulses are applied by a transmission line (such as transmission line 514 of FIG. 5A) and a resonator (such as resonator 512 of FIG. 5A). The upper threshold can be selected to cause a flux quantum to be added to the CJJ loop when the upper threshold is exceeded by applying and combining the global bias and the high-frequency microwave pulses.

At 608, the high-frequency ADDR and/or TRIG (e.g., X and/or Y) microwave pulses are applied to selected devices, e.g., to selected resonator-addressed DACs. In an XY-addressing scheme, the flux bias injected into the DAC by the ADDR (or X) line can be one-half of the flux needed to cause the combined address signal current (see, for example, FIG. 7A) to exceed a threshold for programming the DAC, and the flux bias injected into the DAC by the TRIG (or Y) line can similarly be one-half of the flux needed to cause the combined address signal current to exceed a threshold for programming the DAC. The DAC is programmed only when a threshold is exceeded in the combined address signal current (see, for example, FIGS. 7A-7C and accompanying description). The systems and methods described in the present application can cause the threshold to be exceeded when a) a sufficient flux bias is applied by a global address bias line, and b) there are pulses on the ADDR (X) and TRIG (Y) address lines.

Use of a global flux bias can be beneficial for at least the following two reasons. Firstly, the global flux bias breaks the symmetry, and eliminates, or at least reduces, the possibility that the method described above causes the DAC to be "de-programmed". De-programming refers to removal of a flux quantum or flux quanta from a DAC storage loop. In regular operation, a DAC can be intentionally programmed and de-programmed by adding or removing, respectively, flux quanta from the DAC storage loop. Unintentional de-programming can be eliminated or at least reduced by breaking the DAC symmetry, for example by adding a DC flux offset with a global line or using asymmetric junctions (as described below). Secondly, the bias reduces the power requirements for the high-frequency microwave pulses.

At 610, the programming system determines whether it is ready to lower the address line. If, the programming system determines it is ready to lower the address line, then method 600 proceeds to 612, otherwise it continues to wait. At 612, the global address bias line level is lowered below a predetermined threshold, thereby reducing the global flux bias applied to the DACs. Lowering the address line below the predetermined lower threshold causes the flux quantum to move into the DAC storage loop.

At 614, the programming system determines whether programming is complete. If, the programming system determines that programming is complete, then method 600 proceeds to 616, otherwise it continues to wait. At 616, the power line is returned to its initial level. In some implementations, the power line is returned to zero current. At 618, the address line is returned to its initial level. In some implementations, the address line is returned to zero current.

Figure 7A:
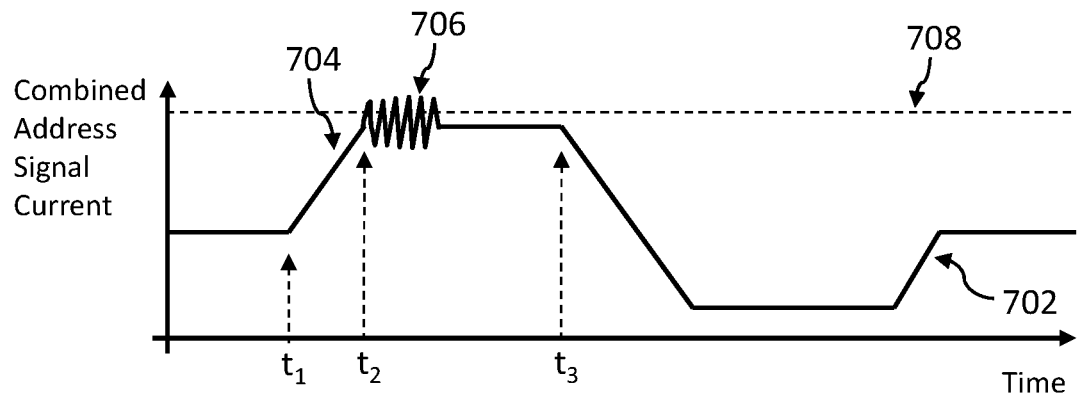
FIGS. 7A, 7B and 7C are schematic plots illustrating an example time series for loading of a single flux quantum, according to the present disclosure, and in particular
Figure 7B:
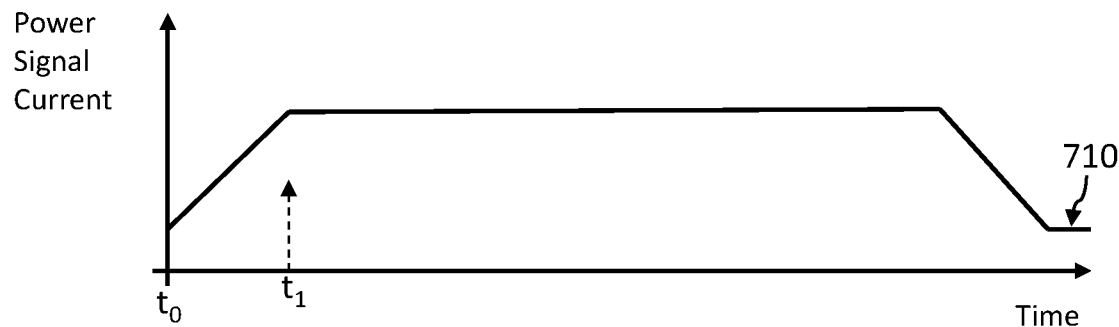
Figure 7C:
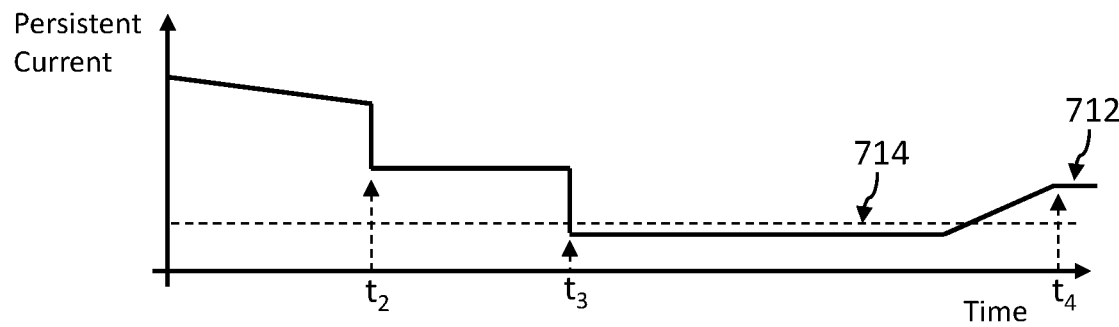

FIGS. 7A, 7B and 7C are graphs showing plots illustrating an example time series for loading of a single flux quantum according to the present disclosure. FIG. 7A is a plot of the combined address signal current 702 as a function of time. Combined address signal current 702 includes a global bias 704 and high-frequency pulses 706. Combined address signal current is raised above threshold 708 to cause loading of a single flux quantum into a DAC CJJ loop.

FIG. 7B is a plot of a power signal current 710 as a function of time. At time $t_0$, power signal current 710 is raised. At time $t_1$, power signal current 710 is raised.

Referring again to FIG. 7A, combined address signal current exceeds threshold 708 at time $t_2$. At time $t_3$, global bias 704 is lowered thereby lowering combined address signal current 702.

FIG. 7C is a plot of the persistent current 712 in the DAC storage loop as a function of time. Persistent current 712 steps down at time $t_2$, and steps down again at time $t_3$. At time $t_3$, persistent current 712 steps down below a predetermined lower threshold 714.

In the example illustrated in FIG. 7C, the DAC persistent current at to is zero. After $t_2$, persistent current 712 includes a current induced by magnetic flux added to the DAC CJJ loop. After $t_3$, persistent current 712 includes a current induced by magnetic flux moved from the DAC CJJ loop into the DAC storage loop. After $t_4$, persistent current 712 includes a current induced by the one or more flux quanta stored in the DAC.

Loading one or more flux quanta into the DAC is also referred to in the present application as programming the DAC. Programming the DAC can also include removing one or more flux quanta from the DAC storage loop, and is also referred to in the present application as de-programming. In one implementation, removing one or more flux quanta from the DAC storage loop includes reversing a signal on an address line.

Two additional control interfaces can be included to ensure programming can be completed by intersecting resonators. The two additional control interfaces are to control the phase and the amplitude of the driving tones (also referred to in the present application as resonant frequencies). Calibration can be used determine a range over which the phase and the amplitude of the driving tones can be adjusted consistent with programming for a target DAC. Depending on the size of the range, it can be possible to program multiple devices at the same time. The size of the range can at least partially depend on: a) a variation in the current amplitude over the length of the resonator, and/or b) a degree of homogeneity in a coupling between each resonator and a respective CJJ loop.

Addressing Technology for Superconducting Devices

Figure 8:
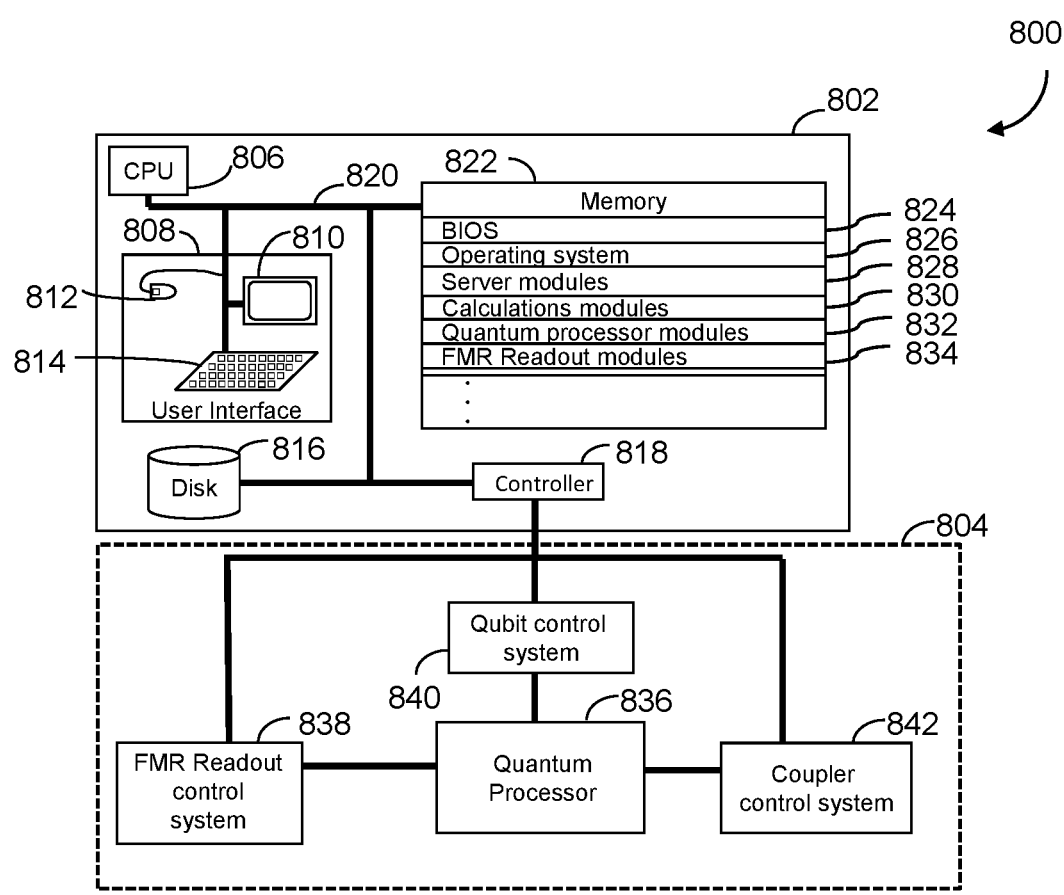
FIG. 8 is a schematic diagram of an exemplary computing system including a digital computer and an analog computer, in accordance with the present disclosure.

FIG. 8 shows a hybrid computing system 800 according to at least one exemplary implementation, including a digital computer 802 and a quantum computer 804, that may incorporate systems and methods described in the present application, including resonator-addressed DACs.

Digital computer 802 comprises CPU 806, user interface elements 808, 810, 812 and 814, disk 816, controller 818, bus 820 and memory 822. Memory 822 comprises modules 824, 826, 828, 830, and 832, and FMR Readout module 834.

Quantum computer 804 can incorporate FMR technology comprising superconducting resonators (such as superconducting resonator 302 of FIG. 3A). Quantum computer 804 can comprise a resonator-addressed DAC such as resonator-addressed DAC 502 of FIGS. 5A-5F. Quantum computer 804 comprises quantum processor 836, FMR readout control system 838, qubit control system 840 and coupler control system 842.

Power Line (Z) Frequency-Multiplexed Flux-DAC Addressing

As described above, a shortcoming of a conventional scheme for addressing a superconducting device, for example a flux storage device such as DAC, can be that an implementation of the conventional scheme may include a large number of wires and superconducting low-pass filters which can be costly to produce, vulnerable to failure, and a source of high-energy photons from internal filter heating. In some implementations, the wires are twisted-pairs and the low-pass filters are custom-made superconducting low-pass filters. The systems and methods described in the present application include replacing wires by coaxial cable which can provide greater bandwidth and reduced complexity. A benefit of greater bandwidth can be improved processor input/output (I/O) speed.

The systems and methods described in the present application include frequency-domain multiplexing of signals on microwave lines. The systems and methods described in the present application include programming a DAC, or other suitable superconducting device on a superconducting circuit, by using signals to activate power line resonators with calibrated resonator amplitudes, and by using signals to implement an XY-addressing scheme (such as trigger and address signals described in the present application).

In some implementations of addressing schemes, superconducting devices are addressable on a three-dimensional grid using combinations of three external bias signals. One of these external bias signals is typically a common current bias provided to a set of one or more superconducting devices. The line that provides the common current bias is referred to in the present application as a power (PWR) line. Each PWR line can provide a current bias to a respective set of one or more superconducting devices.

The other two bias signals are referred to in the present application as trigger (TRIG) and address (ADDR) biases. See, for example, a description of XYZ-addressing of flux DACs earlier in the present application.

As described above with reference to FIGS. 5A through 5F, FIG. 6, and FIG. 7A through 7C, programming of a DAC coupled to two superconducting resonators can be achieved by having a low-frequency bias signal and two microwave signals combine constructively to exceed a determined address latching level. The arrangement can be used to construct an XY-addressing scheme for a set of DACs. In one implementation, an array of superconducting resonators is laid out across a superconducting integrated circuit (e.g., a quantum processor) in a two-dimensional grid. A global low-frequency bias address line is coupled to each DAC CJJ loop of the set of DAC CJJ loops. Programming a selected DAC can be achieved by pre-biasing the set of DAC CJJ loops, and activating the two resonators (also referred to in the present application as the address and trigger resonators) that intersect at the selected DAC.

Some implementations employ an XYZ-addressing scheme in which a low-frequency or DC current bias is applied to a DAC by a line referred to in the present application as a power (PWR) line. Current bias line 526 of FIGS. 5A and 5B, and current bias lines 526*a* and 526*b* of FIG. 5C are examples of PWR lines. As described below, in some implementations, a PWR line can be driven by an alternating current (AC) signal. The AC signal may include a DC component. Also, as described below, Josephson junctions in a CJJ of a DAC may be asymmetric, i.e., may have different critical currents, in which case a DC bias provided by a PWR line, for example, may be at least reduced. The phrase "at least reduced" in the present application means eliminated or reduced. In some implementations, a PWR line to a DAC with asymmetric junctions is driven by an AC signal, and the AC signal may have no DC component.

A superconducting integrated circuit may be fabricated with Josephson junctions that have different critical currents. Josephson junctions may have critical currents that lie within a range of critical currents. A critical current of a Josephson current may depend on various factors including junction size. Adequate control of junction size during fabrication can be advantageous in targeting a desired critical current value. For example, in some cases, critical current is at least approximately proportional to the square of a junction diameter.

In a conventional arrangement, the PWR lines provide a DC bias and are generally galvanically coupled to a body of the DAC. The DC bias can be applied to an array of DACs referred to in the present application as a domain or power domain. The domains are the Z-dimension in the XYZ-addressing scheme. In an example implementation of a quantum processor, the quantum processor includes 24 domains supplied by 24 twisted pair lines. Programming a DAC in a domain can include applying a DC bias to the domain, and applying XY signals (as described above) to a CJJ loop of the DAC.

The present application describes a technology for providing a PWR bias by a superconducting resonator. The domain can include one or more DACs coupled to a superconducting resonator. The superconductor resonator can be supplied with a DC bias as a DC current through a body of the superconducting resonator. The DC current can be common to multiple resonators and can be supplied, for example, by a single twisted pair. The domain can be activated (to provide Z-addressing of the domain) by exciting microwave current in the resonator.

The PWR lines can be frequency-multiplexed. Frequency-multiplexing on the transmission line can be used to activate one of an array of resonators coupled to the transmission line.

In some implementations of the technology described in the present application, a superconducting resonator used to provide a PWR bias can be a superconducting resonator that is communicatively coupled to a microwave transmission line.

The technology described in the present application can cause a low-frequency (or DC) PWR bias to be combined with a high-frequency (e.g., microwave) current along the resonator body to provide PWR addressing. The low-frequency bias can be applied to more than one resonator. The low-frequency bias can be a global bias applied to a set of resonators.

In some implementations (e.g., implementations described below with reference to FIGS. 9A and 9B), programming the DAC (or other suitable superconducting device or flux storage device) includes summing the low-frequency (or DC) and high-frequency (or microwave) currents in the resonator body. In other implementations (e.g., implementations described with references to FIGS. 5A through 5F, FIG. 6, and FIGS. 7A through 7C), low-frequency and high-frequency signals are combined by summing of flux in a CJJ (such as CJJ 506 of FIG. 5A).

The technology described in the present application integrates a superconducting resonator with a DC line. In some implementations, the DC line is integrated with an electronic filter. In some implementations, a superconducting resonator (or an array of superconducting resonators) and a DC line are integrated on-chip. The integrated component can sum currents in at least two frequency bands (e.g., microwave and DC).

It is generally desirable for the low-frequency signal path to the superconducting resonator to have a high impedance at microwave frequencies. One reason for having a high impedance at microwave frequencies is to reduce a load on the superconducting resonator. The inclusion of an electronic filter in the low-frequency signal path can cause the low-frequency (or DC) line to appear as a high impedance at a microwave frequency, e.g., a resonance frequency of the superconducting resonator. In some implementations (including those discussed with reference to FIG. 10, and those that include an array of superconducting resonators), the inclusion of an electronic filter in the low-frequency signal path can cause a decoupling of two superconducting resonators.

Figure 9A:
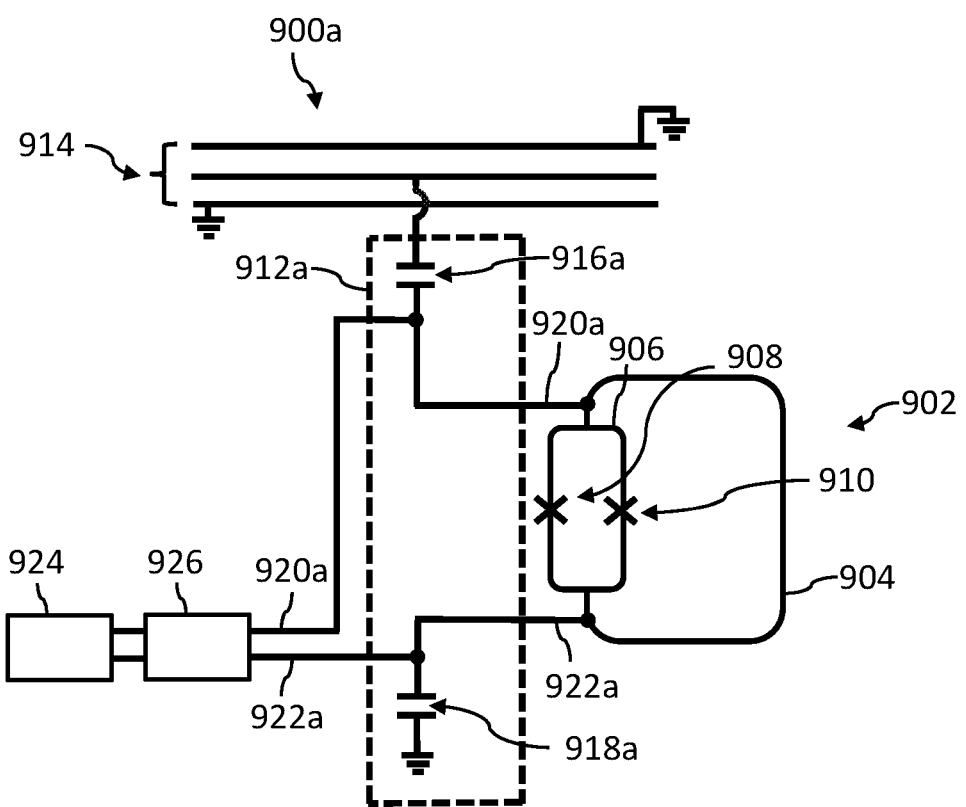
FIG. 9A is a schematic diagram illustrating an example implementation of a superconducting circuit, according to the present disclosure.

FIG. 9A is a schematic diagram illustrating an example implementation of a superconducting circuit 900*a*, according to the present disclosure. Superconducting circuit 900*a* includes a superconducting device addressed by a superconducting resonator. The superconducting device can be a superconducting flux storage device such as resonator-addressed DAC 902 of FIG. 9A, according to the present disclosure.

Superconducting circuit 900*a* can provide Z (power line) addressing of resonator-addressed DAC 902. As described above, a DC bias can be supplied to a body of a resonator, and summed with a high-frequency current from a microwave transmission line. Z (power line) addressing can be achieved by selectively activating a domain using a high-frequency (microwave) current.

In superconducting circuit 900*a*, resonator-addressed DAC 902 includes a loop 904 of material that is superconductive in a range of temperatures, and a compound Josephson junction (CJJ) 906. CJJ 906 includes two parallel current paths each interrupted by a Josephson junction, Josephson junctions 908 and 910, respectively.

Superconducting circuit 900*a* further includes a resonator 912*a*, and a transmission line 914. Resonator 912*a* of FIG. 9A is referred to in the present application as a power (PWR) line resonator. Resonator 912*a* includes coupling capacitors 916*a* and 918*a*, and lines 920*a* and 922*a* to resonator-addressed DAC 902.

Lines 920*a* and 922*a* are communicatively coupled to a low-frequency (or DC) signal source 924 by an electronic filter 926. Electronic filter 926 is operable to remove selected frequency components. Selected frequency components can include a high-frequency component. Selected frequency components can include a resonance frequency of a superconducting resonator. Electronic filter 926 can be a low-pass filter, a notch filter, or a band-pass filter.

Instead of capacitively communicatively coupling resonator 912*a* to transmission line 914 by coupling capacitor 916*a*, resonator 912*a* can be communicatively coupled to transmission line 914 by an inductive coupling. For example, resonator 912a can be inductively communicatively coupled to transmission line 914 by an inductive coupling to a portion of the body of resonator 912a. See, for example, FIGS. 5E and 5F.

In some implementations, multiple resonators are coupled to a single DAC CJJ loop. See, for example, FIG. 5B.

Figure 9B:
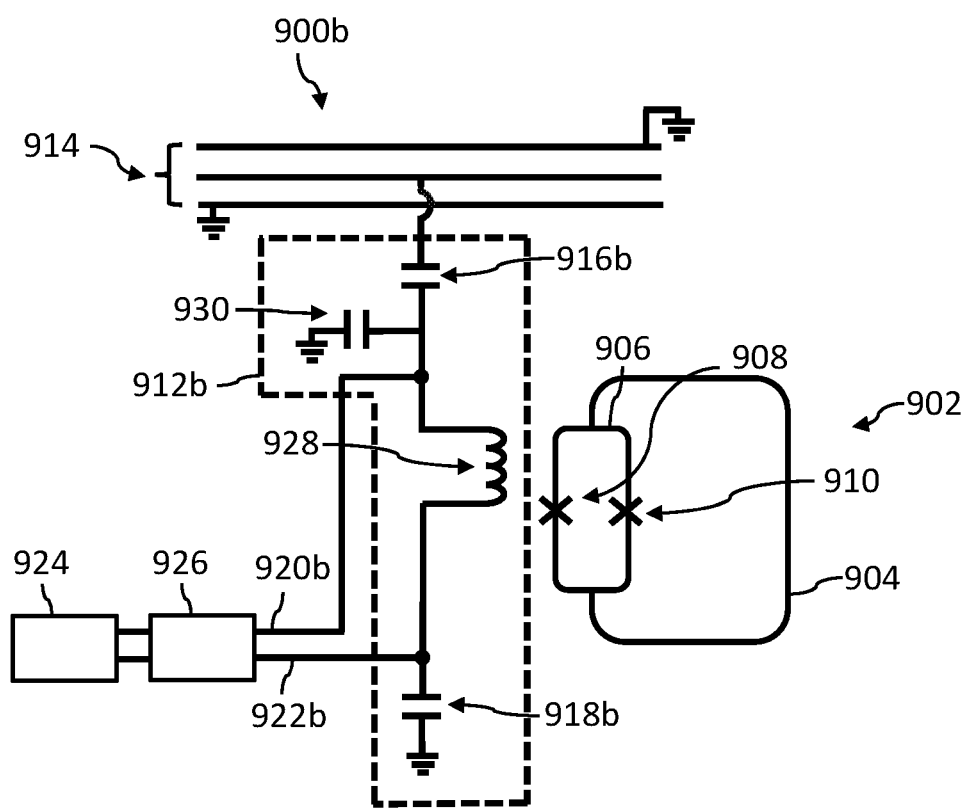
FIG. 9B is a schematic diagram illustrating another example implementation of a superconducting circuit, according to the present disclosure.

FIG. 9B is a schematic diagram illustrating another example implementation of a superconducting circuit 900b, according to the present disclosure. Superconducting circuit 900b includes a superconducting device addressed by a superconducting resonator. The superconducting device can be a superconducting flux storage device such as resonator-addressed DAC 902 of FIG. 9B. The same reference numbers as used in FIG. 9A are used in FIG. 9B to denote the same or similar elements.

In superconducting circuit 900b, resonator-addressed DAC 902 includes a loop 904 of material that is superconductive in a range of temperatures, and a CJJ 906. CJJ 906 includes two parallel current paths each interrupted by a Josephson junction, Josephson junctions 908 and 910, respectively.

Superconducting circuit 900a further includes a resonator 912b, and a transmission line 914. Resonator 912b of FIG. 9B is referred to in the present application as an XY-resonator. Resonator 912b includes coupling capacitors 916b and 918b, and lines 920b and 922b which are communicatively coupled to a low-frequency (or DC) signal source 924 by an electronic filter 926. Electronic filter 926 is operable to remove selected frequency components. Selected frequency components can include a high-frequency component. Selected frequency components can include a resonance frequency of a superconducting resonator. Electronic filter 926 can be a low-pass filter, a notch filter, or a band-pass filter.

Referring again to FIG. 5A, superconducting circuit 500a includes resonator 512 (referred to in the present application as an XY resonator—for its role in XY addressing described in the present application), and interface 516 and global flux bias line 516-1. In the implementation of superconducting circuit 900b of FIG. 9B, interface 516 and global flux bias line 516-1 are replaced by a DC current bias supplied to the body of resonator 912b of FIG. 9B by signal source 924 on a signal path that includes electronic filter 926.

A benefit of superconducting circuit 900b over superconducting circuit 500a is that interface 516 and global flux bias line 516-1 can be eliminated in some implementations, thereby reducing a challenge of laying out superconducting circuit 900b, e.g., reducing an area occupied by superconducting circuit 900b on a superconducting integrated circuit.

Instead of capacitively communicatively coupling resonator 912b of FIG. 9B to transmission line 914 by coupling capacitor 916b, resonator 912b can be communicatively coupled to transmission line 914 by an inductive coupling. For example, resonator 912b can be inductively communicatively coupled to transmission line 914 by an inductive coupling to a portion of the body of resonator 912. See, for example, FIGS. 5E and 5F. In some implementations, multiple resonators are coupled to a single DAC CJJ loop. See, for example, FIG. 5B.

Resonator 912b further includes an inductive interface 928 to resonator-addressed DAC 902. The term "inductive interface" is also referred to in the present application as a coupling inductance. Coupling inductance 928 inductively communicatively couples resonator 912b and resonator-addressed DAC 902.

Resonator 912b further includes an optional shunting capacitor 930.

Asymmetry of Josephson Junctions in CJJ

As described above, a compound Josephson junction (CJJ) (for example, CJJ 906 of FIG. 9) includes two parallel current paths each interrupted by a Josephson junction (for example, Josephson junctions 908 and 910, respectively).

In some implementations, as described above, applying a bias current, a low-frequency flux bias, and a high-frequency flux bias in combination may cause a combined address signal level to exceed a defined address signal latching level for a superconducting flux storage device.

In some implementations, the Josephson junctions of the CJJ are asymmetric, i.e., a critical current of one junction is different from a critical current of the other junction. A bias current that, in combination with a low-frequency flux bias and a high-frequency flux bias, causes a combined address signal level to exceed a defined address signal latching level for a superconducting flux storage device may be at least reduced by an asymmetry in the Josephson junctions of the CJJ. In some implementations, the current bias line is eliminated.

Figure 9C:
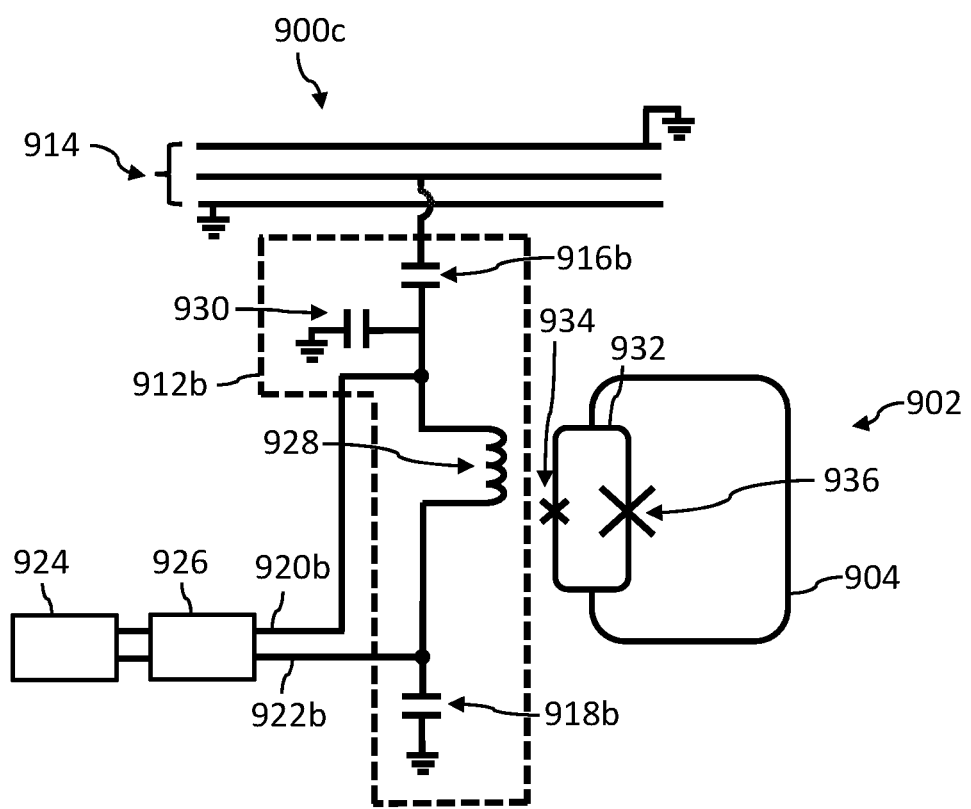
FIG. 9C is a schematic diagram illustrating an example implementation of a superconducting circuit with asymmetric Josephson junctions in a compound Josephson junction of a superconducting flux storage device, according to the present disclosure.

FIG. 9C is a schematic diagram illustrating an example implementation of a superconducting circuit 900c with asymmetric Josephson junctions in a compound Josephson junction of a superconducting flux storage device, according to the present disclosure. Superconducting circuit 900c is the same as superconducting circuit 900b except that CJJ 906 of FIG. 9B is replaced by CJJ 932. CJJ 932 comprises asymmetric Josephson junctions 934 and 936.

An asymmetry of Josephson junctions 934 and 936 is indicated for the purposes of FIG. 9C by a smaller symbol for Josephson junction 934 than for Josephson junction 936. As explained in more detail below, an asymmetry refers to a difference in critical currents between Josephson junctions 934 and 936. In some implementations, the difference in critical currents may at least in part depend on a difference in size between Josephson junctions 934 and 936. In other implementations, Josephson junction 934 and 936 have different critical currents while being at least approximately the same size.

In the present application, a CJJ with an asymmetry in the Josephson junctions of the CJJ refers to a CJJ that includes two parallel current paths each parallel current path interrupted by a respective Josephson junction, in which the critical current of a Josephson junction interrupting one of the two parallel current paths of the CJJ is not the same as the critical current of a Josephson junction interrupting the other of the two parallel current paths of the CJJ.

Critical current has a specific meaning with respect to a Josephson junction that would be known to one of ordinary skill in the art. Equations governing the dynamics of a Josephson junction and the Josephson effect include the following:

$$U(t) = \frac{\hbar}{2e} \frac{\partial \varphi}{\partial t}$$

The above equation can be referred to as the superconducting phase evolution equation and relates the voltage U(t) across a Josephson junction to the change in phase difference φ(t) across the Josephson junction.

$$I(t) = I_C \sin \varphi(t)$$

The above equation can be referred to as the Josephson or weak-link current-phase relation, and describes the current I(t) through the Josephson junction. The current $I_C$ is a constant referred to as the critical current of the Josephson junction.

These equations can be found, for example, in Barone, A., and Paterno, G., Physics and Applications of the Josephson Effect, (1982), John Wiley & Sons, ISBN 978-0-471-01469-0.

The critical current is the current in a superconductive material above which the material is normal (not superconducting) and below which the material is superconducting, at a specified temperature and in the absence of external magnetic fields. See, for example, Critical Current. (n.d.) *McGraw-Hill Dictionary of Scientific & Technical Terms, 6E.* (2003). Retrieved Oct. 23, 2018 from https://encyclopedia2.thefreedictionary.com/Critical+Current.

In yet other implementations, a low-frequency flux bias that, in combination with a bias current and a high-frequency flux bias, causes a combined address signal level to exceed a defined address signal latching level for a superconducting flux storage device is at least reduced by an asymmetry in the Josephson junctions of the CJJ. In some implementations, the low-frequency flux bias line is eliminated. In some implementations, both the current bias line and the low-frequency flux line are eliminated.

More generally, other suitable DAC addressing schemes can include asymmetry of Josephson junctions, for example in a CJJ of a DAC (or other flux storage device). In the case of a resonator-addressed DAC, a resonator can provide a sinusoidal flux signal to a CJJ loop of the DAC, and can advantageously allow for elimination of a global DC flux bias line, for example, and/or a current bias line.

Process control monitoring (PCM) line for an array of capacitively-coupled superconducting resonators.

As described in the present application, an array of superconducting resonators can be coupled to a single transmission line, and used, for example, to enable frequency-domain multiplexing in a variety of applications (e.g., in applications involving qubits, kinetic-inductance detectors (KIDs), transition-edge sensors and in other applications which can be integrated with resonant devices).

It can be desirable to probe a superconducting device or a superconducting integrated circuit using a low-frequency or DC signal at room temperature (or at least at a higher temperature than a cryogenic temperature) to determine whether a resonator body in the device, or circuit, includes an electrical short or open, or has an unexpected resistance. An electrical short, open, or unexpected resistance can be caused by, for example, shrinkage of a critical dimension, variations in the thickness of a layer in a multilayer integrated circuit, material quality issues, and/or other fabrication issues.

One approach to dealing with fabrication failures is to simply accept a loss in yield. In some applications, for example, KIDs are used for imaging, and the loss of a few resonators corresponds to the loss of a few pixels in an imaging array. This can be acceptable as the array can be scanned over the image area in order to fill-in the missing data arising from the loss of pixels. In other applications, a frequency-multiplexed resonant readout uses an array of resonators for readout of qubit values in a quantum processor. The loss of a few resonators results in a commensurate reduction in readout speed, and may be acceptable.

In other applications, it can be important to know that at least an acceptable number of resonators in an array of resonators have yielded. In an application where an array of resonators is used to address an array of superconducting flux-DACs in a quantum processor, loss of a resonator can result in an inoperable processor. In another application where a large-scale array of superconducting transmon qubits is used for gate-model quantum computing, loss of a resonator can similarly result in an inoperable system. A transmon qubit is a type of superconducting charge qubit. Transmon is an abbreviation of transmission line shunted plasma oscillation qubit.

For at least these reasons, it can be advantageous to measure the health of an array of resonators at room temperature (or at least at a higher temperature than a cryogenic temperature) to reduce the likelihood of encountering an inoperable resonator after a system has been cooled to a cryogenic temperature.

The systems and methods described in the present application include the use of a low-frequency or DC line at a temperature higher than a cryogenic temperature to determine the health of a resonator in an array of superconducting resonators or the health of a qubit in an array of superconducting qubits. In some implementations, the resonators in the array of superconducting resonators is capacitively communicatively coupled to one or more transmission lines (e.g., microwave transmission lines). In other implementations, the resonators in the array of superconducting resonators are inductively coupled to one or more transmission lines.

In some implementations, the PCM line is also used, during operation of a superconducting circuit, as a DC bias line. The DC bias line may be global DC bias line. The superconducting circuit may include an array of capacitively-coupled superconducting resonators.

As described above with reference to FIGS. 9A and 9B, a DC bias can be added to a resonator body. The DC bias of FIGS. 9A and 9B can be used to probe the health of a resonator at a temperature higher than a cryogenic temperature, for example at room temperature (approximately 20° C.). For example, the DC bias can be used to probe for an electrical short, an open, or an unexpected resistance.

Figure 10:
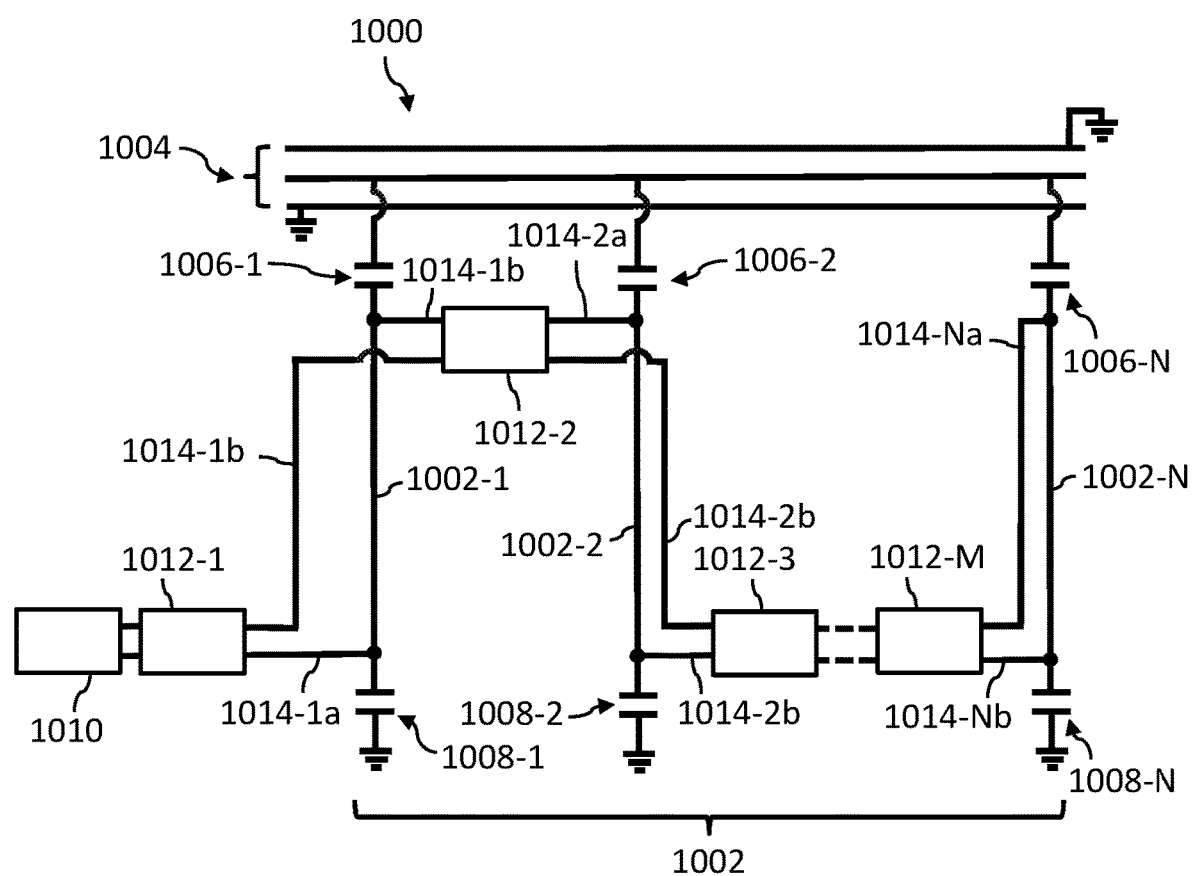
FIG. 10 is a schematic diagram illustrating an example implementation of a superconducting circuit that includes an array of resonators, according to the present disclosure.

FIG. 10 is a schematic diagram illustrating an example implementation of a superconducting circuit 1000 that includes an array of N resonators 1002-1, 1002-2, and 1002-N (collectively referred to in the present application as resonators 1002), according to the present disclosure. Though at least three resonators are shown in FIG. 10, the number N of resonators in array of N resonators 1002 can be less than three or more than three.

Array of N resonators 1002 can be XY resonators or Z resonators (as described in the present application), for example. For example, resonator 912a of FIG. 9A (a Z resonator) can be a member of an array of resonators communicatively coupled to one another and to a transmission line as illustrated by array of N resonators 1002 of FIG. 10. Similarly, resonator 912b (an XY resonator) of FIG. 9B can be a member of an array of resonators communicatively coupled to one another and to a transmission line as illustrated by array of N resonators 1002 of FIG. 10.

FIG. 10 is an example implementation of a superconducting circuit that can be used to assess whether a DC short or open is present in a body of a resonator in an array of resonators. The array of resonators can be an array of superconducting resonators. A superconducting resonator is a resonator with a resonator body that is superconducting below a critical temperature. The superconducting resonator can be capacitively coupled or inductively coupled to a transmission line, for example a microwave transmission line. The microwave transmission line can be, for example, one of a microstrip transmission line, a stripline transmission line, a coaxial transmission line, and a co-planar waveguide transmission line.

Superconducting circuit 1000 of FIG. 10 includes a DC wire that communicatively couples one or more resonators in an array of resonators to a signal source. In this configuration, the resonator bodies can be wired in series at DC. As described with reference to FIG. 10 below, one or more electronic filters can be used to at least reduce cross-talk between resonators.

The example implementation of FIG. 10 includes a DC bias for DAC power line resonators (see FIGS. 9A and 9B above). In other implementations, a DC bias can be included for address and trigger line resonators (e.g., address and trigger line resonators described in the present application). Each resonator of resonators 1002 is capacitively communicatively coupled to transmission line 1004 by a respective coupling capacitance 1006-1, 1006-2, and 1006-N (collectively referred to in the present application as coupling capacitances 1006) and a respective coupling capacitance 1008-1, 1008-2, and 1008N (collectively referred to in the present application as coupling capacitances 1008). While FIG. 10 shows each resonator of resonators 1002 coupled to transmission line 1004, at least one resonator of resonators 1002 can be coupled to another transmission line (not shown in FIG. 10).

Each resonator of resonators 1002 is communicatively coupled by a respective pair of lines and at least one electronic filter to a signal source 1010. The at least one electronic filter belongs to an array of electronic filters 1012-1, 1012-2, 1012-3, and 1012-M (collectively referred to in the present application as electronic filters 1012). For example, resonator 1002-1 is communicatively coupled by lines 1014-1a and 1014-1b and electronic filters 1012-1 and 1012-2. Resonator 1002-2 is communicatively coupled by lines 1014-2a and 1014-2b and electronic filters 1012-2 and 1012-3. Resonator 1002-N is communicatively coupled by lines 1014-Na and 1014-Nb and electronic filter 1012-M.

Each filter of electronic filters 1012 can be a low-pass filter, a notch filter, or a band-pass filter. It is generally desirable that each filter of electronic filters 1012 at least reduces the magnitude of components of a signal from signal source 1010 at one or more resonant frequency bands of resonators 1002.

FIG. 11 is a schematic diagram illustrating an example implementation of a superconducting circuit 1100 that includes a first broadband switch 1102a, according to the present disclosure. In some implementations, a second broadband switch 1102b may be employed together with first broadband switch 1102a.

First and second broadband switches 1102a and 1102b may be implemented as broadband switch 1202 of FIG. 12 and may be used as part of a superconducting circuit to address a device. Superconducting circuit 1100 includes a resonator addressed DAC 1104.

In superconducting circuit 1100, resonator-addressed DAC 1104 includes a loop 1106 of material that is superconductive in a range of temperatures, and a compound Josephson junction (CJJ) 1108. CJJ 1108 includes two parallel current paths each interrupted by a Josephson junction, Josephson junctions 1110 and 1112, respectively.

Superconducting circuit 1100 further includes a resonator 1114, a transmission line 1116, and interface 1118 operable to provide a global flux bias by a global flux bias line 1118-1. Resonator 1114 includes coupling capacitors 1120 and 1122, an inductive interface 1124 to resonator-addressed DAC 1104, and an optional shunting capacitor 1126. The term "inductive interface" is also referred to in the present application as a coupling inductance. Coupling inductance 1124 inductively communicatively couples resonator 1114 and resonator-addressed DAC 1104.

Instead of capacitively communicatively coupling resonator 1114 to transmission line 1116 by coupling capacitor 1120, resonator 1114 can be communicatively coupled to transmission line 1116 by an inductive coupling. For example, resonator 1114 can be inductively communicatively coupled to transmission line 1116 by an inductive coupling to a portion of the body of resonator 1114.

Superconducting circuit 1100 further includes a current bias line 1128 operable to provide a current bias to resonator-addressed DAC 1104.

FIG. 12 is a schematic diagram of an example implementation of a transmission line layout 1200 according to the present systems, methods and apparatus. Transmission line layout 1200 may be used for dynamically isolating a device, such as a superconducting processor. Transmission line 1200 comprises a broadband switch 1202 with a number N of cascade elements 1204_1 through 1204_N (collectively 1204) electrically coupled in series.

Each cascade element 1204 may be implemented as cascade element 1300 of FIG. 13. It is understood by those skilled in the art that transmission line layout 1200 may be of different construction, and the description of FIG. 12 is specific to one implementation. In particular, the number N of cascade elements in broadband switch 1202 may be different from the number of DC-SQUIDs 1310a and 1310b.

Transmission line 1200 comprises transmission lines 1206, 1208 and 1210. Transmission line 1210 passes through each cascade element 1204. A first end of transmission lines 1206, 1208 and 1210 (e.g., the right-hand sides in the plane of the drawing sheet of FIG. 12) is electrically communicatively coupled to a device (e.g., a superconducting processor, not shown in FIG. 12), and a second end of transmission lines 1206, 1208 and 1210 (e.g., the left-hand sides) is electrically communicatively coupled to signal electronics (e.g., readout lines, not shown in FIG. 12).

Transmission lines 1206, 1208 and 1210 may comprise vias 1212 and 1214 to connect to ground. Vias 1212 and 1214 can cause transmission lines 1206, 1208 and 1210 to stay at approximately the same electrical potential during an operation cycle of the device.

Each cascade element 1204 in broadband switch 1202 is electrically connected by lines 1216_1 through 1216_N (collectively 1216) to transmission line 1208 to ground.

Broadband switch 1202 comprises activation lines 1218 and 1220 and inductances 1218_a and 1220_a that are operable to cause the state of each cascade element 1204 to change from a suppression state to a passing state, and vice versa. Activation lines 1218 and 1220 are electrically coupled to cascade elements 1204_1 and 1204_N, respectively. In at least one implementation, activation lines 1218 and 1220 are poor electrical conductors over the frequency range used for transmitting electrical signal to the device, and receiving electric signals from the device (e.g., 4 GHz-8 GHz), for example activation lines 1218 and 1220 can provide ≥4 kΩ impedance at 4 GHz. In the passing phase, broadband switch 1202 allows the transmission of signals, and, in the suppression phase, broadband switch 1202 suppresses blackbody radiation. In one implementation, activation lines 1218 and 1220 may be implemented as a low-frequency twisted pair. Line 1222 and inductances 1222_a through 1222_n electrically couple successive cascade elements 1204 (e.g., cascade element 1204_1 to cascade element 1204_2) to provide high impedance to photons, thus at least partially obstructing a pathway to the device.

When broadband switch 1202 is implemented with cascade elements such as cascade elements 1300 of FIG. 13, activation line 1218 corresponds to activation line 1318 for cascade element 1204_1, and line 1222 to activation line 1320. Similarly, line 1222 corresponds to activation line 1318, and activation line 1220 to activation line 1320 for cascade element 1204_N.

In at least one implementation, filtering elements may be integrated into activation lines 1218 and 1220 to at least limit the introduction of noise while allowing broadband switch 1202 to operate at a desired operating speed. For example, passive filtering elements or inductive chokes can be used. In addition, filtering elements may be made of superconducting material or elements, such as kinetic inductors. Examples of kinetic inductors are discussed in detail in International Patent Publication No. WO2017192733A2 "SYSTEMS AND METHODS FOR SUPERCONDUCTING DEVICES USED IN SUPERCONDUCTING CIRCUITS AND SCALABLE COMPUTING", filed May 3, 2017.

In one implementation, broadband switch 1202 may be used as part of a superconducting circuit comprising microwave paths, as described above with reference to FIG. 11.

FIG. 13 is a schematic diagram of an example implementation of a single cascade element 1300 according to the present systems, methods and apparatus. Cascade element 1300 may be used as one of a plurality of cascade of elements as part of a broadband switch for dynamically isolating a device, such as a superconducting processor. See, for example, FIG. 12 and its accompanying description.

Cascade element 1300 comprises a transmission line 1302. A first end of transmission line 1302 (e.g., the right-hand side in the plane of the page of FIG. 13) is electrically connected to a device (e.g., a superconducting processor, not shown in FIG. 13) and a second end of transmission line 1302 (e.g., the left-hand side in the plane of the page of FIG. 13) is electrically connected to signal electronics (e.g., readout lines, not shown in FIG. 13). Readout electronics may be in an exterior environment, at a different temperature than the operating temperature of the device. Readout electronics may be in an exterior environment, at a different temperature than the operating temperature of the device.

Cascade element 1300 comprises a first segment 1304 and a second segment 1306, where first segment 1304 is on the left-hand side of a matching capacitor 1308 in the plane of the drawing sheet of FIG. 13, and second segment 1306 is on the right-hand side of matching capacitor 1308 in the plane of the drawing sheet of FIG. 13. First segment 1304 comprises a number N of DC-SQUIDs 1310a_1 through 1310a_N (collectively 1310a) in series, and second segment 1306 comprises a number M of DC-SQUIDs 1310b_1 through 1310b_M (collectively 1310b) in series. In at least one implementation, the number of DC-SQUIDs 1310a is equal to the number of DC-SQUIDs 1310b. In some implementations, cascade element 1300 may comprise RF-SQUIDs.

Each DC-SQUID 1310a and 1310b comprises a pair Josephson junctions 1312a and 1312b (collectively 1312, only one pair called out to reduce clutter). Each Josephson junction of the pair of Josephson junctions 1312 has a respective critical current $I_c$. Each DC-SQUID 1310a and 1310b is inductively coupled by inductance 1314a_1 through 1314a_N (collectively 1314a, only one called out in FIG. 13 to reduce clutter) and 1314b_1 through 1314b_M (collectively 1314b, only one called out in FIG. 13 to reduce clutter), respectively, to activation line loops 1316a_1 through 1316a_N (collectively 1316a) and 1316b_1 through 1316b_M (collectively 1316b), respectively.

Loops 1316a are electrically coupled to activation line 1318, and loops 1316b are electrically coupled to activation line 1320. Activation lines 1318 and 1320 are operable to cause the state of cascade element 1300 to change from a suppression state to a passing state, and vice versa, when used as part of a broadband switch for dynamic isolation of a device, such as a superconducting processor.

Cascade element 1300 is symmetric with respect to matching capacitor 1308. Inductance 1314a and 1314b are approximately the same for DC-SQUIDs 1310a and 1310b, respectively, and junctions 1312 have approximately the same critical current $I_c$ for DC_SQUIDs 1310a and 1310b. In some implementations, small variations during building and assembly may lead to values of inductance 1314a and 1314b and of critical current $I_c$ that are not identical for each DC-SQUID of DC-SQUIDs 1310a and 1310b.

The various embodiments and implementations of the present application describe addressing schemes that include the following:

a low-frequency current bias in combination with a low-frequency flux bias (also referred to in the present application as YZ addressing and/or XYZ addressing);

a low-frequency current bias in combination with a low-frequency flux bias and a high-frequency flux bias (also referred to in the present application as YZ addressing and/or XYZ addressing where Y and/or X can be frequency-domain multiplexed);

a low-frequency current bias in combination with a high-frequency current bias and a low-frequency flux bias (also referred to in the present application as YZ addressing and/or XYZ addressing where Z can be frequency-domain multiplexed); and a low-frequency current bias in combination with a high-frequency current bias, a low-frequency flux bias, and a high-frequency flux bias (also referred to in the present application as YZ and/or XYZ addressing where X, Y, and/or Z can be frequency-domain multiplexed.

In each of the above addressing schemes, the high-frequency bias (which can be a current bias across a CJJ loop and/or a flux bias into a CJJ loop) can be provided by a respective superconducting resonator. The superconducting resonator may enable frequency-domain multiplexing.

In each of the above addressing schemes, asymmetry of Josephson junctions in a CJJ of a DAC can eliminate, or at least reduce the contribution of, a low-frequency current bias line and/or a low-frequency flux bias line.

AC-Driven DAC—DAC Rectifier

In some implementations of input/output (I/O) systems, flux is stored in a DAC by using direct current (DC) and/or DC pulses.

The systems and methods described in the present application include a flux DAC driven by an alternating current (AC). A flux DAC driven by an alternating current (AC) is also referred to in the present application as an AC-driven flux DAC. Benefits of an I/O system that uses an AC-driven flux DAC can include a) frequency-domain multiplexing (FDM), and b) minimizing, or at least reducing, drift noise by using higher frequencies and/or by eliminating DC components.

In some implementations, an AC signal to an AC-driven flux DAC (e.g., an AC signal on a PWR line) is periodic (e.g., sinusoidal), and a DC bias can be used to break the symmetry. In some implementations, an asymmetry of Josephson junctions in the CJJ of the DAC can be used to break the symmetry. Breaking the symmetry can eliminate, or at least reduce the contribution of, a DC bias in a DAC addressing scheme. Removing DC components can advantageously reduce drift noise.

It can be beneficial to reduce the number of input/output lines to a quantum processor. The use of FDM can reduce the number of input/output lines to the quantum processor. In some implementations, FDM may be particularly suitable for higher-frequency (e.g. GHz lines, e.g. ADDR and TRIG lines.

In some implementations of an AC-driven flux DAC, an I/O system applies a first AC signal to a PWR line. (See the section above on XYZ-Addressing of Flux DACs for a description of addressing lines.) The first AC signal may be at a frequency in the MHz region of the electromagnetic spectrum. The I/O system may drive an ADDR and/or TRIG line with a second AC signal. The second AC signal may be at a frequency in the GHz region of the electromagnetic spectrum. The second AC signal may be used to drive the ADDR and/or TRIG line selectively on one half-cycle (positive or negative half-cycle) of the first AC signal applied to the PWR line.

The present systems and methods can include determining a suitable frequency for the first AC signal. For example, a suitable frequency can be determined at least in part by an analysis of limits imposed by the I/O system. The limits are also referred to in the present application as I/O frequency cut-offs. For example, a suitable frequency can be determined at least in part by performing a trade-off between an acceptable level of drift noise and an upper bound on the rate at which flux quanta can be loaded into a storage loop of the DAC.

During operation of the DAC, the second AC signal used to drive the TRIG line can be synchronized with the first AC signal applied to the PWR line so that the I/O system drives the TRIG line with pulses selectively on one half-cycle (positive or negative half-cycle) of the first AC signal for adding or removing flux quanta to/from the DAC storage loop.

Storing flux in a superconducting loop by operation of an AC-driven flux DAC can cause a DC current to circulate in the superconducting loop.

In some implementations, an AC-driven flux DAC is included in the fabric of a quantum processor (such as quantum processor 836 of FIG. 8—also referred to in the present application as a QPU). In some implementations, an AC-driven flux DAC is an element of an on-chip memory that is driven by AC signals, rather than DC signals.

Figure 14:
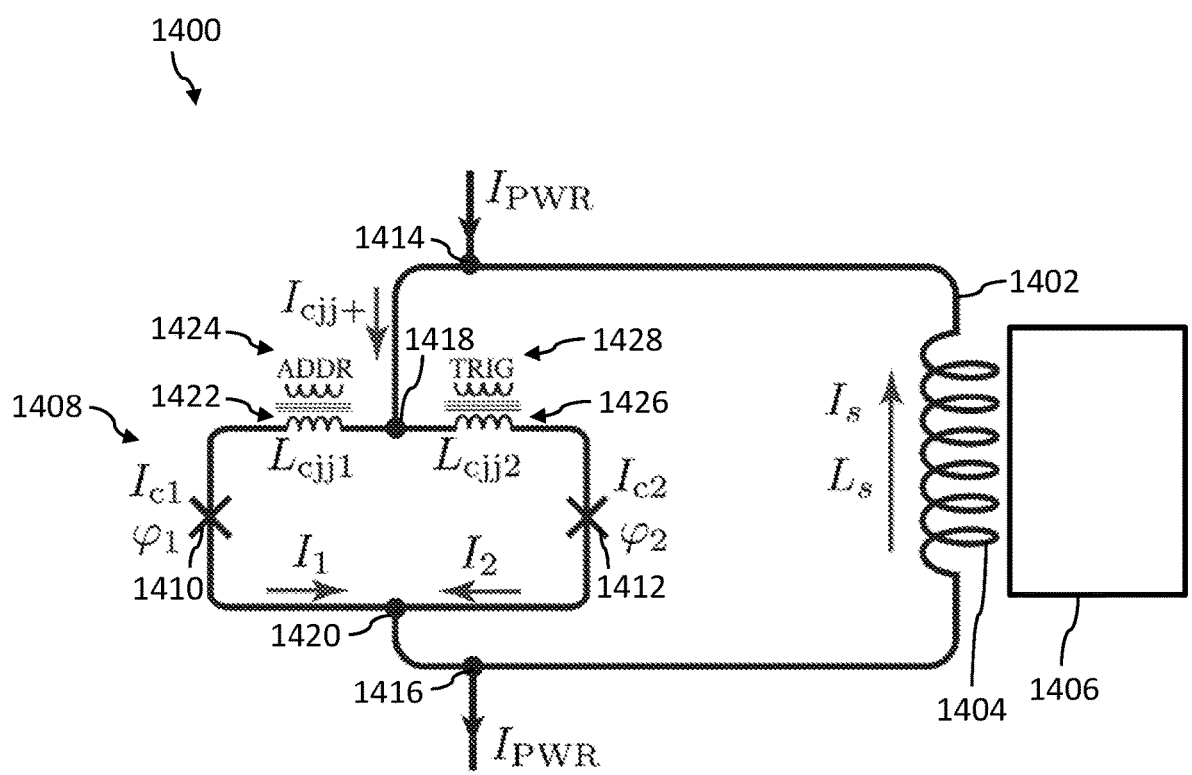
FIG. 14 is a schematic diagram of a superconducting DAC, according to the present disclosure.

FIG. 14 is a schematic diagram of a superconducting DAC 1400, according to the present disclosure. Superconducting DAC 1400 can be an element in an I/O system. The I/O system can be an element of a quantum computer. The I/O system can write data to a quantum processor, and read data from a quantum processor.

DAC 1400 includes a superconducting loop 1402. Superconducting loop 1402 can include or consist of a superconducting metal, e.g., niobium, aluminum and the like. Superconducting loop 1402 can be used to store flux. Flux can be loaded into superconducting loop 1402 of DAC 1400 in multiples of magnetic flux quanta.

Superconducting loop 1402 of DAC 1400 is interrupted by an inductance 1404. DAC 1400 can be inductively communicatively coupled to a device 1406 by inductance 1404 and a mutual inductance with device 1406.

Superconducting loop 1402 of DAC 1400 is also interrupted by a compound Josephson junction 1408. Compound Josephson junction (CJJ) 1408 includes two parallel superconducting paths, each of the two parallel superconducting paths interrupted by a respective Josephson junction, 1410 and 1412.

A PWR line is superconductingly electrically communicatively coupled to superconducting loop 1402 of DAC 1400 at nodes 1414 and 1416. Current enters from the PWR line at node 1414, and leaves superconducting loop 1402 at node 1416.

CJJ 1408 interrupts superconducting loop 1402 between nodes 1418 and 1420. An inductance 1422 between node 1418 and Josephson junction 1410 is inductively communicatively coupled to an ADDR line 1424. An inductance 1426 between node 1418 and Josephson junction 1412 is inductively communicatively coupled to a TRIG line 1428.

Superconductivity is a set of physical properties observed in a material where electrical resistance of the material vanishes and magnetic flux fields are expelled from the material. A material exhibiting these properties is referred to in the present application as a superconductor. A material exhibiting these properties is also referred to in the present application as a superconducting material. A superconductor typically has a characteristic critical temperature below which its electrical resistance drops to zero. An electric current in a loop of superconducting material can persist indefinitely with no power source.

The various embodiments described above can be combined to provide further embodiments. To the extent that they are not inconsistent with the specific teachings and definitions herein, all of the U.S. patents, U.S. patent application publications, U.S. patent applications, foreign patents, and foreign patent applications referred to in this specification and/or listed in the Application Data Sheet that are assigned to the assignee of this patent application, including but not limited to the following: PCT Patent Application No. WO2016US031885 (published as International patent application publication WO2016183213A1), FREQUENCY MULTIPLEXED RESONATOR INPUT AND/OR OUTPUT FOR A SUPERCONDUCTING DEVICE, filed May 11, 2016; PCT Patent Application No. WO2018016237, SYSTEMS AND METHODS FOR FABRICATION OF SUPERCONDUCTING INTEGRATED CIRCUITS, filed Jan. 31, 2018; U.S. Provisional Patent Application No. 62/636,043, SYSTEMS AND METHODS FOR COUPLING A SUPERCONDUCTING TRANSMISSION LINE TO AN ARRAY OF RESONATORS, filed Feb. 27, 2018; PCT Patent Application US2019/18792 (published as International patent application publication WO2019168721A1), SYSTEMS AND METHODS FOR COUPLING A SUPERCONDUCTING TRANSMISSION LINE TO AN ARRAY OF RESONATORS, filed Feb. 20, 2019; U.S. patent application Ser. No. 16/397,790, DYNAMICAL ISOLATION OF A CRYOGENIC PROCESSOR, filed Apr. 29, 2019; U.S. Provisional Patent Application No. 62/778,643, DYNAMICAL ISOLATION OF A CRYOGENIC PROCESSOR, filed Dec. 12, 2018; US Provisional Patent Application No. 62/680,824, DYNAMICAL ISOLATION OF A CRYOGENIC PROCESSOR, filed Jun. 5, 2018; U.S. Provisional Patent Application No. 62/679,079, SYSTEMS AND METHODS FOR ADDRESSING DEVICES IN A SUPERCONDUCTING CIRCUIT, filed Jun. 1, 2018; U.S. Provisional Patent Application No. 62/672,392, SYSTEMS AND METHODS FOR ADDRESSING DEVICES IN A SUPERCONDUCTING CIRCUIT, filed May 16, 2018; PCT Patent Application PCT/US2019/032689 (published as International patent application publication WO2019222514A1), SYSTEMS AND METHODS FOR ADDRESSING DEVICES IN A SUPERCONDUCTING CIRCUIT, filed May 16, 2019; US Provisional Patent Application No. 62/683,253, SYSTEMS AND METHODS FOR ADDRESSING DEVICES IN A SUPERCONDUCTING CIRCUIT, filed Jun. 11, 2018; and U.S. Provisional Patent Application No. 62/888,605, SYSTEMS AND METHODS FOR ADDRESSING DEVICES IN A SUPERCONDUCTING CIRCUIT, filed Aug. 19, 2019 are incorporated herein by reference, in their entireties. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting integrated circuit comprising:
a microwave transmission line;
a superconducting flux storage device comprising a loop of material that is superconductive below a critical temperature interrupted by an asymmetric compound Josephson junction (CJJ), the asymmetric CJJ comprising:
  a first parallel current path interrupted by a first Josephson junction, the first Josephson junction characterized by a first critical current; and
  a second parallel current path interrupted by a second Josephson junction, the second parallel current path electrically in parallel with the first parallel current path, the second Josephson junction characterized by a second critical current, the second critical current of the second Josephson junction different from the first critical current of the first Josephson junction;
a first superconducting resonator communicatively coupled to the microwave transmission line; and
a first signal interface that inductively communicatively couples the first superconducting resonator to the superconducting flux storage device,
wherein the first signal interface is operable to provide a first flux bias to the superconducting flux storage device.

2. The superconducting integrated circuit of claim 1 further comprising:
a low-frequency address bias line; and
an address interface that inductively communicatively couples the low-frequency bias address line to the superconducting flux storage device, wherein the address interface is operable to provide a second flux bias to the superconducting flux storage device.

3. The superconducting integrated circuit of claim 2, wherein the superconducting flux storage device comprises a superconducting digital-to-analog converter (DAC), the superconducting DAC which is operable to perform latching, and the superconducting DAC is programmed by a low-frequency bias signal carried by the low-frequency address bias line and by a microwave signal carried by the first superconducting resonator, which combine constructively to exceed a threshold address latching level, the low-frequency bias signal carried by the low-frequency address bias line which is at least reduced by a factor that depends on a difference between the first critical current of the first Josephson junction of the CJJ and the second critical current of the second Josephson junction of the CJJ.

4. The superconducting integrated circuit of claim 1, further comprising a current bias line, wherein a current in the current bias line is an alternating current.

5. The superconducting integrated circuit of claim 4, wherein the alternating current has no DC component.

6. The superconducting integrated circuit of claim 1, further comprising:
a second superconducting resonator communicatively coupled to the microwave transmission line; and
a second signal interface that inductively communicatively couples the second superconducting resonator to the superconducting flux storage device,
wherein the second signal interface is operable to provide a second flux bias to the superconducting flux storage device.

7. The superconducting integrated circuit of claim 6, wherein the first superconducting resonator extends along a first axis and the second superconducting resonator extends along a second axis, the second axis perpendicular to the first axis.

8. The superconducting integrated circuit of claim 6, wherein the superconducting flux storage device is XY-addressed by two microwave signals, a first one of the two microwave signals carried by the first superconducting resonator, and a second one of the two microwave signals carried by the second superconducting resonator, each of the first and the second superconducting resonator having a respective resonant frequency, the respective resonant frequencies of the first and the second superconducting resonators which in operation add constructively at the superconducting flux storage device.

9. The superconducting integrated circuit of claim 8, wherein the respective resonant frequencies of the first and the second superconducting resonators add constructively at the superconducting flux storage device to provide a beat signal, a frequency of the beat signal which is matched to a linewidth of at least one of the first and the second superconducting resonators.

10. The superconducting integrated circuit of claim 6, wherein the superconducting flux storage device comprises a superconducting digital-to-analog converter (DAC), the superconducting DAC which is operable to perform latching, and the superconducting DAC is programmed by a low-frequency bias signal carried by a low-frequency address bias line and by two microwave signals, which combine constructively to exceed a threshold address latching level, the low-frequency bias signal carried by the low-frequency address bias line which is at least reduced by a factor that depends on a difference between the first critical current of the first Josephson junction of the CJJ and the second critical current of the second Josephson junction of the CJJ.

11. The superconducting integrated circuit of claim 1, wherein a size of the second Josephson junction is different from a size of the first Josephson junction.

12. A method of loading a superconducting flux storage device with a magnetic flux quantum, the superconducting flux storage device comprising a superconducting flux storage loop interrupted by an asymmetric compound Josephson junction (CJJ), the asymmetric CJJ comprising:
a first parallel current path interrupted by a first Josephson junction, the first Josephson junction characterized by a first critical current; and
a second parallel current path interrupted by a second Josephson junction, the second parallel current path electrically in parallel with the first parallel current path, the second Josephson junction characterized by a second critical current, the second critical current of the second Josephson junction different than the first critical current of the first Josephson junction, the superconducting flux storage devices, the method comprising:

applying a first high-frequency pulse to at least a first superconducting resonator by a microwave transmission line, the microwave transmission line communicatively coupled to the at least a first superconducting resonator; and applying the first high-frequency pulse to the superconducting flux storage device by the at least a first superconducting resonator, the at least a first superconducting resonator communicatively coupled to the superconducting flux storage device, to cause a flux quantum to be added to the asymmetric CJJ of the superconducting flux storage device.

13. The method of claim 12, further comprising:
setting a current bias line to a first current bias value;
setting a low-frequency address line to a first address line value;
setting the current bias line to a second current bias line value to cause a current bias to be applied to the superconducting flux storage device;
setting the low-frequency address line to a second address line value to cause a flux bias to be applied to the asymmetric CJJ of the superconducting flux storage device;
after the applying a first high-frequency pulse to the superconducting flux storage device, setting the low-frequency address line to a third address line value to cause the flux quantum to be loaded into the superconducting flux storage loop of the superconducting flux storage device;
returning the current bias line to the first current bias line value; and
returning the low-frequency address line to the first address line value, wherein applying a first high-frequency pulse to the superconducting flux storage device by a microwave transmission line and a first superconducting resonator includes causing a combined low-frequency and high-frequency signal level applied to the superconducting flux storage device to exceed a predetermined upper threshold, and wherein at least one of the second current bias line value and the second address line value is at least reduced by a factor that depends on a difference between the first critical current of the first Josephson junction of the asymmetric CJJ and the second critical current of the second Josephson junction of the asymmetric CJJ.

14. The method of claim 13, wherein setting the low-frequency address line to a third address line value to cause the flux quantum to be loaded into the superconducting flux storage loop of the superconducting flux storage device includes setting the low-frequency address line to a third address line value to cause the flux quantum to be loaded into a superconducting digital-to-analog converter (DAC).

15. The method of claim 12, wherein applying a first high-frequency pulse to the superconducting flux storage device by a microwave transmission line and at least a first superconducting resonator includes applying a set of frequency-domain multiplex signals to each of the first superconducting resonator and at least a second superconducting resonator.

16. The method of claim 12, further comprising:
applying the first high-frequency pulse to a second superconducting flux storage device by the microwave transmission line and the at least a first superconducting resonator.

17. The method of claim 12, wherein applying a first high-frequency pulse to the superconducting flux storage device by a microwave transmission line and at least a first superconducting resonator includes applying a first high-frequency pulse to a superconducting digital-to-analog converter (DAC) by the microwave transmission line and a first and at least a second superconducting resonator, the superconducting DAC operable to perform latching.

18. The method of claim 17, further comprising programming the superconducting DAC by a low-frequency bias signal carried by a first low-frequency address bias line and by two microwave signals, the low-frequency bias signal and the two microwave signals which combine constructively to exceed a threshold address latching level.

19. The method of claim 12, further comprising applying an alternating current on a current bias line.

20. The method of claim 19, wherein applying an alternating current on a current bias line includes applying an alternating current having no DC component.

21. A superconducting integrated circuit comprising:
a superconducting flux storage device, the superconducting flux storage device which comprises a loop of material that is superconductive in a range of temperatures, the loop of material which is interrupted by at least one Josephson junction; and
a first addressing line communicatively coupled to the superconducting flux storage device, wherein a current in the first addressing line is an alternating current.

22. The superconducting integrated circuit of claim 21, wherein the at least one Josephson junction is a compound Josephson junction (CJJ), the CJJ comprising:
a first parallel current path which is interrupted by a first Josephson junction; and
a second parallel current path which is interrupted by a second Josephson junction, the second parallel current path which is electrically in parallel with the first parallel current path.

23. The superconducting integrated circuit of claim 22, the first parallel current path which is further interrupted by a first inductance and the second parallel current path which is further interrupted by a second inductance, the superconducting integrated circuit further comprising:
a second addressing line which is inductively coupled to the first inductance; and
a third addressing line which is inductively coupled to the second inductance.

24. The superconducting integrated circuit of claim 23, the loop of material which includes a third inductance, the superconducting integrated circuit further comprising a device inductively communicatively coupled to the superconducting flux storage device by the third inductance.

* * * * *